(12) United States Patent
Uematsu et al.

(10) Patent No.: US 7,447,038 B2
(45) Date of Patent: Nov. 4, 2008

(54) MODULE

(75) Inventors: Yutaka Uematsu, Hachioji (JP); Hideki Osaka, Oiso (JP); Yoji Nishio, Sagamihara (JP); Seiji Funaba, Hitachinaka (JP)

(73) Assignee: Elpida Memory, Inc., Tokyo (JP)

( * ) Notice: Subject to any disclaimer, the term of this patent is extended or adjusted under 35 U.S.C. 154(b) by 497 days.

(21) Appl. No.: 11/304,625

(22) Filed: Dec. 16, 2005

(65) Prior Publication Data

US 2006/0133055 A1 Jun. 22, 2006

(30) Foreign Application Priority Data

Dec. 16, 2004 (JP) .............................. 2004-365004

(51) Int. Cl.
*H05K 1/00* (2006.01)
(52) U.S. Cl. .................. 361/748; 361/780; 361/792; 361/793; 361/794; 361/795; 257/691; 257/723; 257/724
(58) Field of Classification Search .............. 61/748, 61/780, 792–795; 257/691, 723, 724
See application file for complete search history.

(56) References Cited

U.S. PATENT DOCUMENTS

| | | | |
|---|---|---|---|
| 5,177,594 A * | 1/1993 | Chance et al. ............... 257/678 |
| 5,221,858 A * | 6/1993 | Higgins, III ................ 257/666 |
| 6,396,137 B1 * | 5/2002 | Klughart ..................... 257/691 |
| 6,545,895 B1 * | 4/2003 | Li et al. ......................... 365/52 |
| 6,646,425 B2 * | 11/2003 | Miftakhutdinov ........... 323/285 |
| 6,646,945 B1 | 11/2003 | Lee et al. |
| 6,765,844 B2 * | 7/2004 | Fujisawa et al. ........ 365/230.03 |
| 6,864,105 B2 * | 3/2005 | Grube et al. ................... 438/14 |
| 6,930,893 B2 * | 8/2005 | Vinciarelli .................... 363/17 |
| 6,937,971 B1 * | 8/2005 | Smith et al. .................... 703/18 |
| 6,944,080 B2 * | 9/2005 | Sekiguchi et al. ........... 365/214 |
| 7,016,198 B2 * | 3/2006 | Fessler et al. ............... 361/780 |
| 2004/0103383 A1 * | 5/2004 | Tripathi et al. ................. 716/8 |
| 2006/0217906 A1 * | 9/2006 | Barbara et al. ............... 702/60 |

* cited by examiner

*Primary Examiner*—Dean A. Reichard
*Assistant Examiner*—Xiaoliang Chen
(74) *Attorney, Agent, or Firm*—Mattingly, Stanger, Malur & Brundidge, PC

(57) ABSTRACT

In a memory module, a plurality of memories are mounted on a module base plate, impedance between Vref and Vss near each memory is coupled to Vss by a decoupling capacitor and a Vref plane to achieve low impedance configuration in a wide frequency range, Vref planes are individually provided for the respective memories, and the Vref planes are connected to each other by using a high impedance wire, or a high impedance chip part. Accordingly, a wiring technique for a module which allows effective reduction of self noise and propagation noise can be provided.

25 Claims, 27 Drawing Sheets

Top Layer

Top Layer

Top Layer

Inner Layer

Top Layer

Inner Layer

Connection to External Vref Feeding Line

Connection to External Vref Feeding Line

Connection to External Vref Feeding Line

MODULE

CROSS-REFERENCE TO RELATED APPLICATION

The present application claims priority from Japanese patent application No. JP 2004-365004 filed on Dec. 16, 2004, the content of which is hereby incorporated by reference into this application.

BACKGROUND OF THE INVENTION

The present invention relates to a voltage (reference voltage: Vref) that is referred to when a semiconductor device (a memory or the like) used in an information processing device determines a logical value (0 or 1, or the like) in a wiring technique in a module, and in particular to a technique effectively applied in a wiring system for distributing the reference voltage at a low noise level.

For example, semiconductor devices used in an information or data processing device include a device (for example, a DRAM: Dynamic Random Access Memory or the like) which is externally supplied with a reference voltage (Vref) to determine a logical value based upon the voltage. That is, in a binary logic, an input voltage equal to or larger than the fixed voltage (Vref plus a defined voltage) is read as a logical value 1, while the input voltage smaller than the fixed voltage (Vref minus a defined voltage) is read as a logical value 0.

In recent years, according to speed-up of a signal processed in a semiconductor device, such a problem that a malfunction occurs in the semiconductor device due to a logical defect caused by convolution of noises to the Vref is being actualized. Considering types of noises in a memory module as one example, there are three types of noises, i.e., (1) propagation noise from an external system board, (2) noise generated by a memory itself, and (3) propagation noise from another memory on a module base board.

Approaches for reducing all the noises are required for a high-speed semiconductor. As one of the approaches, there is a method using a low pass filter (LPF) disclosed in Patent Document 1 (U.S. Pat. No. 6,646,945). This method is constituted such that the LPF is provided between a system board and a memory module so that noise propagation between the both is cut. The method is effective for reducing the noise (1). The noises (2) and (3) are reduced by a known technique. The known technique is classified to two categories. One is a plane feeding system and the other is a wire feeding system.

SUMMARY OF THE INVENTION

In the above-described technique, however, problems (a) that noise generated by a memory itself can not be reduced sufficiently and (b) that propagation noise from another memory on a module can not be reduced sufficiently occur. As regards the plane feeding system and the wire feeding system, the problems (a) and (b) will be considered below.

The plane feeding system is a feeding system close to an ordinary power source (Vdd) feed, and it is a system where a feeding plane of Vref is provided in parallel with a ground (Vss) plane to couple a Vref plane and the Vss plane capacitively, thereby holding down impedance between Vref and Vss in a high frequency region. The impedance is held down in a low frequency region using a decoupling capacitor. The method is effective against the problem (a), but it is not so effective against the problem (b) because a whole Vref feeding network has low impedance over a wide frequency region evenly. That is, since transfer impedance from a memory to another memory on the same or one module base plate (transfer impedance from port 1 to port 2 on a circuit having 2 ports: Z21=V2/I1, where V2 is an output voltage of port 2 and I1 is an input current from port 1) becomes evenly high, noise becomes easy to propagate. When the feeding plane is large to some extent, surface resonance may be caused, which results in instability of noise characteristic.

The wire feeding system is a feeding system where respective memories are connected like daisy chain using fine wires similar to a signal wire, and transfer impedance thereof is lower than that of the plane feeding system, so that the wire feeding system is relatively effective against the problem (b). However, since the impedance between Vref and Vss is held down only using the decoupling capacitor, the impedance lowers only in a low frequency region, where high frequency noises can not be reduced. Therefore, the wire feeding system is not so effective against the problem (a).

In summary, the plane feeding system is evaluated such that the reduction in self noise is good but the reduction in propagation noise is poor, while the wire feeding system is evaluated such that the reduction in self noise is poor but the reduction in propagation noise is middle.

The present invention has been made for solving the problems (a) and (b) simultaneously, and an object thereof is to provide a wiring technique for a module that can reduce both of self-noise and propagation noise effectively.

The above and other objects and novel features will be apparent from the description of the present specification and the accompanying drawings.

Outlines of representative ones of the inventions disclosed in the present application will briefly described as follows.

The present invention provides a Vref wiring method obtained by combining the following Techniques 1 to 3.

Technique 1: Low impedance in a wide frequency range is achieved by coupling impedance between Vref and Vss near a memory with Vss using a decoupling capacitor and a Vref power source plane.

Technique 2: A Vref power source plane is provided individually for each of memories.

Technique 3: Vref power source plane are connected to each other using a high impedance wire or a high impedance chip part.

Effects obtained from representative ones of the inventions disclosed in the present invention will briefly described as follows.

According to the present invention, the following advantages or merits can be achieved owing to the respective Techniques 1 to 3.

In Technique 1, impedance in a low frequency range of several hundreds MHz or less is lowered by a decoupling capacitor, and impedance between Vref and Vss in a high frequency range of GHz band is lowered by a Vref power source plane. Thereby, noise can be held down over a wide frequency range.

In Technique 2, reduction in propagation noise and suppression in surface resonance are effectively conducted by providing individual Vref power source planes to respective memories.

In Technique 3, propagation noise can be minimized by selecting a wire or a chip part so as to lower propagation impedance. When a chip resistor is used as the chip part, further noise reduction is achieved by inserting a resistor with a resistant value equal to or more than a predetermined resistant value. This is based upon such a method that a Vref feeding network is assumed as a secondary circuit, and such a resistor that a noise current generated in the feeding circuit changes from under-damping to over-damping according to a conditional equation obtained from an electric equation for the secondary circuit is inserted into a feeding circuit.

From the above, the feeding system according to the present invention is evaluated such that the reduction in self-noise is good and the reduction in propagation noise is very good. Thus, the feeding system can reduce self-noise and propagation noise effectively.

DESCRIPTION OF THE PREFERRED EMBODIMENTS

The present invention is for realizing a method for feeding a reference voltage (Vref) to a plurality of semiconductor devices arranged on the same or one base plate at low noise in a semiconductor device handling Vref. In the following explanation, respective embodiments will be explained specifically through an example where a memory which is one example of a semiconductor device is mounted on a memory module which is one example of a module.

First Embodiment

One example of a memory module in a first embodiment will be explained with reference to FIG. 1 to FIG. 11. Incidentally, FIG. 6 to FIG. 11 are views or diagrams for explaining a conventional art which is compared with the present invention for easy understanding of features of the present invention.

The first embodiment is a basic model of the present invention. Here, assuming a memory module, a case that six memories are mounted on a module base plate is shown. The number of memories is not limited to six, but memories of the number more than or less than six may be used. The memories may be mounted on a single side or both sides of the base plate. The memory module is plugged in a module connector mounted on a motherboard, which is a system base plate to be used.

Figure 1:
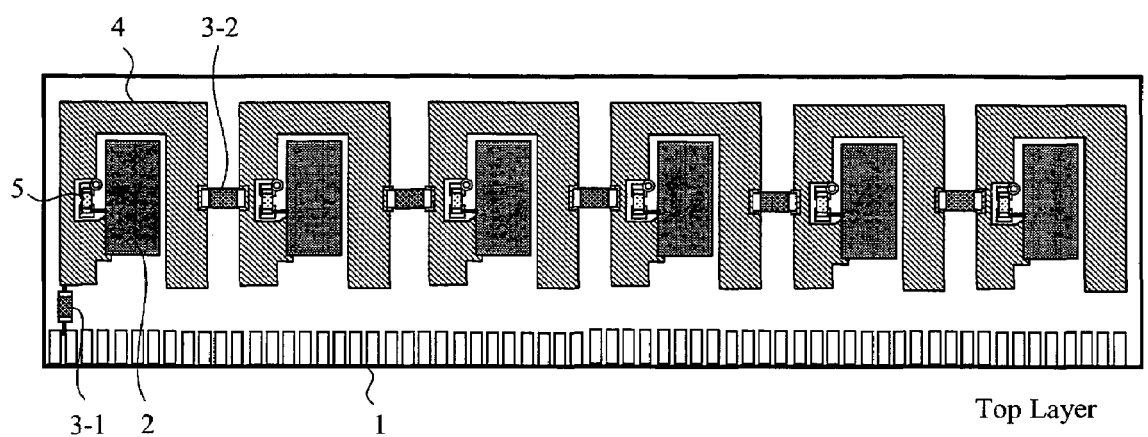
FIG. 1 is an explanatory view showing a Vref wiring system that can realize Vref noise reduction in a memory module according to a first embodiment of the present invention.

FIG. 1 is an explanatory view showing a Vref wiring system for realizing Vref noise reduction and a schematic view of a TOP layer of a module for feeding Vref at low noise. The module of the first embodiment is constituted of a module base plate 1, memories 2 mounted on the module base plate 1, a low pass filter (LPF) or a high impedance part of a chip resistor 3-1 for reducing noise from the motherboard, high impedance parts 3-2 connecting Vref power source planes, each covering a portion around each memory 2, and decoupling capacitors 5, each being disposed between Vref and Vss. Vref power source planes (hereinafter, "Vref plane") 4 are arranged on the module base plate 1. The feature of the embodiment lies in that the Vref planes 4 are provided individually for the respective memories 2 and the Vref planes adjacent to each other are connected to each other the high impedance part 3-2. In the following explanation, how self-noise and propagation noise can be reduced utilizing such a wiring system will be explained.

Figure 2:
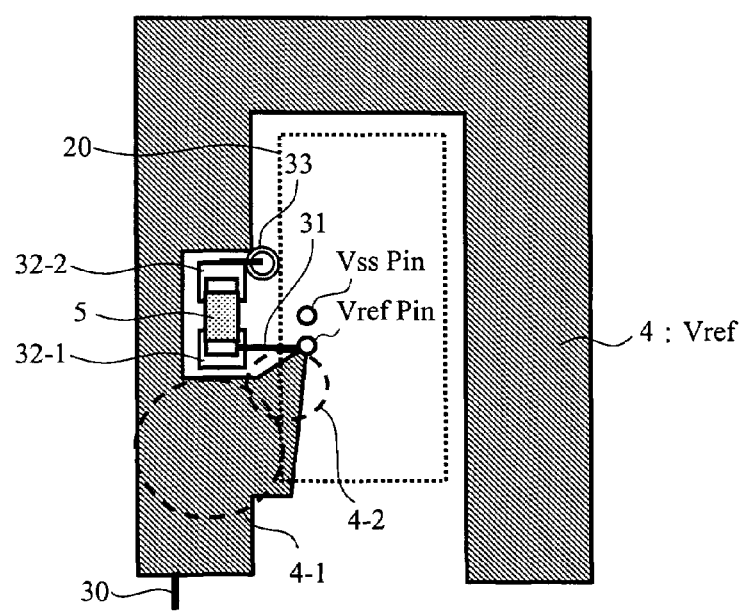
FIG. 2 is an explanatory view showing a portion near a memory mounting portion in the memory module according to the first embodiment of the present invention.

In order to demonstrate a method for reducing self-noise and an advantage obtained thereby, an enlarged view of a portion of the module base plate 1 near a memory mounting portion is shown in FIG. 2. In FIG. 2, reference numeral 20 denotes a memory mounting region (a memory has been removed in FIG. 2), reference numeral 4 denotes a Vref plane (reference numerals 4-1 and 4-2 denote portions thereof), reference numeral 5 denotes a decoupling capacitor, reference numeral 30 denotes a Vref wire for connecting the LPF or the high impedance part of a chip resistor 3-1 shown in FIG. 1 to the Vref plane 4, reference numerals 32-1 and 32-2 denote decoupling capacitor mounting pads (32-1 denotes one on the Vref side, while 32-2 denotes one on the Vss side), and reference numeral 33 denotes a Via to a Vss plane.

As understood from FIG. 2, two feeding wires extend from a Vref pin of the memory mounting portion. One of the wires is a wire 31 to the decoupling capacitor 5, while the other is a Vref plane 4-2. This is equivalent to connection of two kinds of capacitances to a Vref line of the memory 2. Here, impedances of the decoupling capacitor 5 and the Vref plane 4 viewed from the Vref pin will be considered.

First, the impedance of the Vref plane 4 will be considered. The Vref plane 4 can be regarded as capacitance, as explained below. The module base plate 1 is ordinarily constituted of either of about six to eight layers, where a TOP layer (and BOTTOM layer) serve as part mounting faces. In many cases, a layer just below the TOP layer (and a layer just above the BOTTOM layer) are ground (Vss) layers. Therefore, metal parallel plates are formed by the Vref plane 4 and the Vss plane which is the lower layer sandwiching dielectric and it functions as a capacitor. A capacitance at that time can be estimated roughly like an ordinary plate capacitor. When the dielectric constant of dielectric is represented as $\epsilon r$, electric constant is represented as $\epsilon 0$, a inter-plane distance is represented as d, and an area of a surface is represented as S, the capacitance is expressed as follow:

$$C_{plane} = \frac{\varepsilon_r \varepsilon_0 S}{d} \quad [\text{Equation 4}]$$

Here, when $\epsilon 0$ is $8.85 \times 10^{-12}$ F/m, $\epsilon r$ is 4.7, and the inter-plane distance is 100 μm, a plane capacitance $C_{plane}$ per unit area is obtained as 41.6 pF/cm².

Next, the impedance between the Vref plane 4 and the Vref pin on the mounting area 20 will be considered. When space permeability is represented as μo, inductance of a micro-strip wire having a width w, a length 1, and a distance from a ground plane d is estimated roughly using the following equation.

$$L_{line} = \frac{\mu_0 l d}{w} \quad [\text{Equation 5}]$$

Here, when μ0 is $4\pi \times 10^{-7}$ H/m, w is 0.5 mm, and d is 0.1 mm, inductance per unit length $L_{line}$ is obtained as 0.251 nH/mm.

Next, impedance of the decoupling capacitor 5 will be considered. A route between the memory mounting portion and the decoupling capacitor portion is regarded as a series circuit of the leading wire 31, the decoupling capacitor mounting pads 32-1 and 32-2, the decoupling capacitor 5, and the Via 33 from the decoupling capacitor to the ground. The wire 31, the decoupling capacitor mounting pads 32-1 and 32-2, the Via 33 to the ground can be mainly handled as inductance. The decoupling capacitor 5 can be expressed by a series circuit of a capacitance, an equivalent series resistance (ESR), and an equivalent series inductance (ESL).

Figure 3:
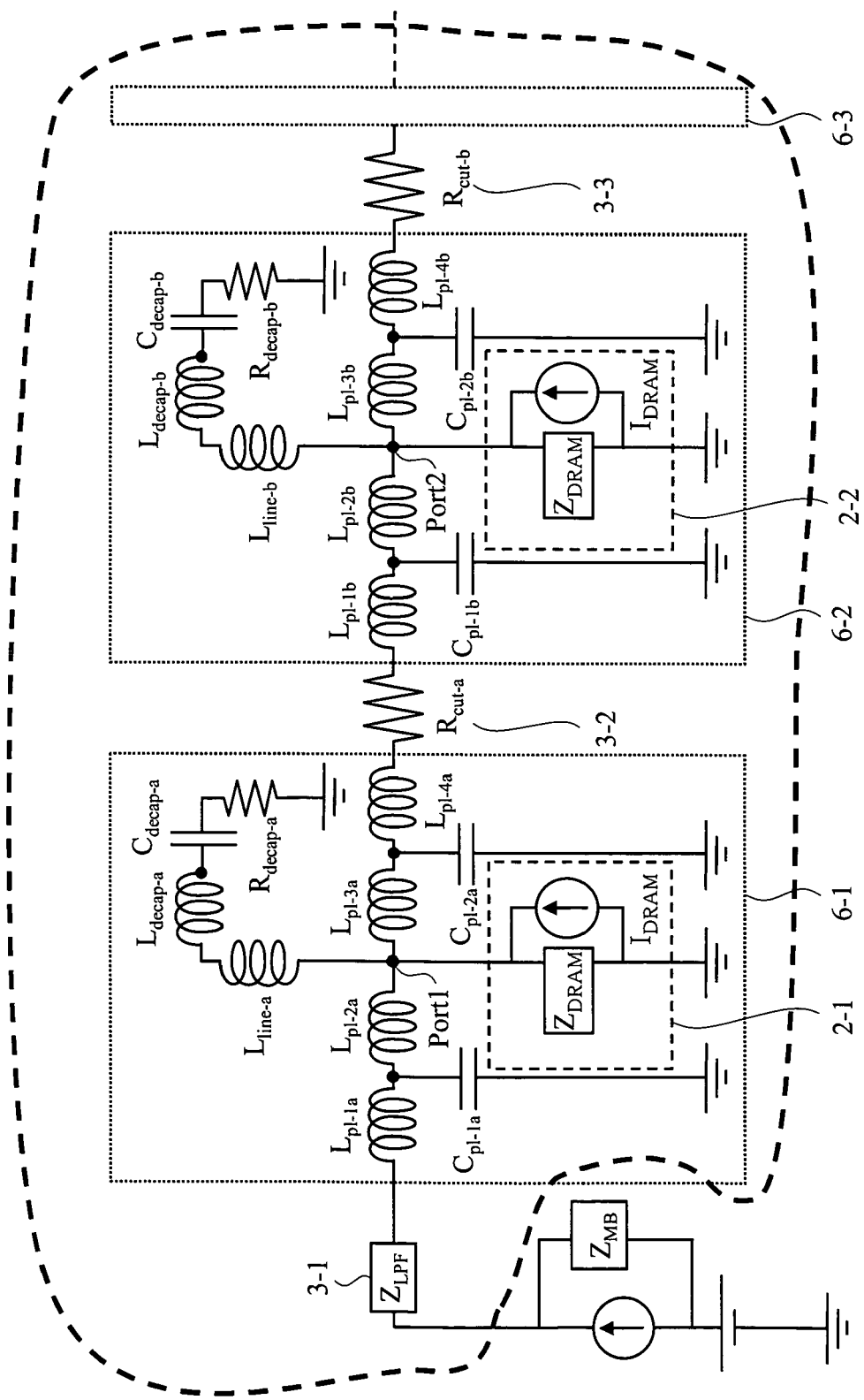
FIG. 3 is an explanatory diagram showing a simple equivalent circuit, which realizes Vref noise reduction in the memory module according to the first embodiment of the present invention.

From the above, the memory module can be expressed by a simple equivalent circuit as shown in FIG. 3.

A portion surrounded by a dotted line in FIG. 3 corresponds to the memory module, and regions 6-1, 6-2, and 6-3 surrounded by other dotted lines in the former dotted line are equivalent circuits of the portions shown in FIG. 2. $Z_{DRAM}$ is an input impedance of the Vref portion of the memory (namely, an impedance between the Vref pin and the Vss pin in the memory), $I_{DRAM}$ is a Vref noise current generated by the memory, $C_{p1-1}*$ (* denotes a or b) is a capacitance of a portion of the surface positioned near the Vref pin of the memory (the potion indicated by reference numeral 4-1 in FIG. 2), $L_{p1-2}*$ is an inductance of a portion from the Vref pin to $C_{p1-1}*$ (the portion indicated by reference numeral 4-2 in FIG. 2), $L_{p1-1}^*$ is an inductance of a route from an entrance from a Vref plane of an adjacent memory (or module entrance) to $C_{p1-1}^*$, $C_{p1-2}^*$ is a Vref plane capacitance of a portion of the Vref plane far from the Vref pin (namely, a portion of the Vref pane except for the portion 4-1), and each of $L_{p1-3}^*$ and $L_{p1-4}^*$ is an inductance of a route of the surface having $C_{p1-2}^*$ like the above. The equivalent circuit of the decoupling capacitor is expressed by a series circuit of $L_{decap-}^*$ of the ESL, $R_{decap-}^*$ of the ESR, and $C_{decap-}^*$ of the capacitance, and an inductance of the route portion from the decoupling capacitance to the Vref pin of the memory (the mounting pads, the wire and the Via) is expressed by $L_{line-}^*$. The high impedance chip part indicated by reference numeral 3-2 in FIG. 1 is expressed by $R_{cut-}^*$.

The reason why the present invention is effective for (1) self noise reduction and (2) propagation noise reduction will be explained using the equivalent circuit.

First, (1) self noise reduction will be explained.

In order to reduce the self noise, it is necessary to lower an impedance between Vref and Vss in a memory. This means reduction in impedance between Port 1 and Vss in FIG. 3. Such reduction can be realized by the decoupling capacitor and the Vref plane mounted around the memory. By connecting an impedance line having two different capacitances and two different inductances to the Port 1, the impedance can be kept in a wide frequency range. The decoupling capacitor suppresses low frequency noises by a large capacitance and a large inductance, while the Vref plane suppresses high frequency noises by a small capacitance and a small inductance. Further consideration is taken using specific numerical values.

Here, regarding an actual Vref plane, the impedance is considered. Assuming that a plane area indicated by reference numeral 4-1 is 1 cm$^2$, the capacitance $C_{p1-1a}$ becomes 41.6 pF. Assuming that the portion indicated by reference numeral 4-2 has a width of 0.5 mm and a length of 2 mm, an inductance thereof becomes 0.502 nH. Incidentally, since $L_{p1-3}^*$ is sufficiently larger than $L_{p1-2}^*$, an impedance of a far plane portion becomes large, so that the impedance can be excluded.

Next, an impedance of the decoupling capacitor is considered. First, inductances of respective portions in a component included in $L_{line-}^*$ are considered. When the leading wire has w=0.1 mm, d=0.1 mm, and l=4 mm, an inductance thereof becomes about 5 nH. An inductance of the mounting pad is about 3 nH (Literature: Richard K. Ulrich, et all, "Integrated Passive Component Technology", pp. 165, John Wiley & Sons, Inc., 2003). An inductance of the Via is expressed by the following equation.

$$L_{via} = 5.08h \left[ \ln\left(\frac{4h}{D}\right) + 1 \right] [nH] \quad \text{[Equation 6]}$$

Here, h is a length of the Via and D is a diameter of the Via. When h is 1 mm and D is 0.3 mm, 18.2 pH can be obtained. The total of these values can be handled as the impedance of the route except for the decoupling capacitor. That is, the inductance can be regarded as about 8 nH.

1 nH, 100 mΩ, and 0.1 μF can be assigned to the respective values of $L_{decap-}^*$, $R_{decap-}^*$, and $C_{decap-}^*$ of the decoupling capacitor.

Here, a resonant frequency of the Vref plane and the decoupling capacitor in the impedance line is obtained. The impedance becomes minimum at the resonant frequency, and it is determined according to inductance L and capacitance C. A resonant frequency $f_{res}$ according to inductance Li and capacitance Ci is expressed by the following equation.

$$f_{res} = \frac{1}{2\pi\sqrt{L_i C_i}} \quad \text{[Equation 7]}$$

Figure 4:
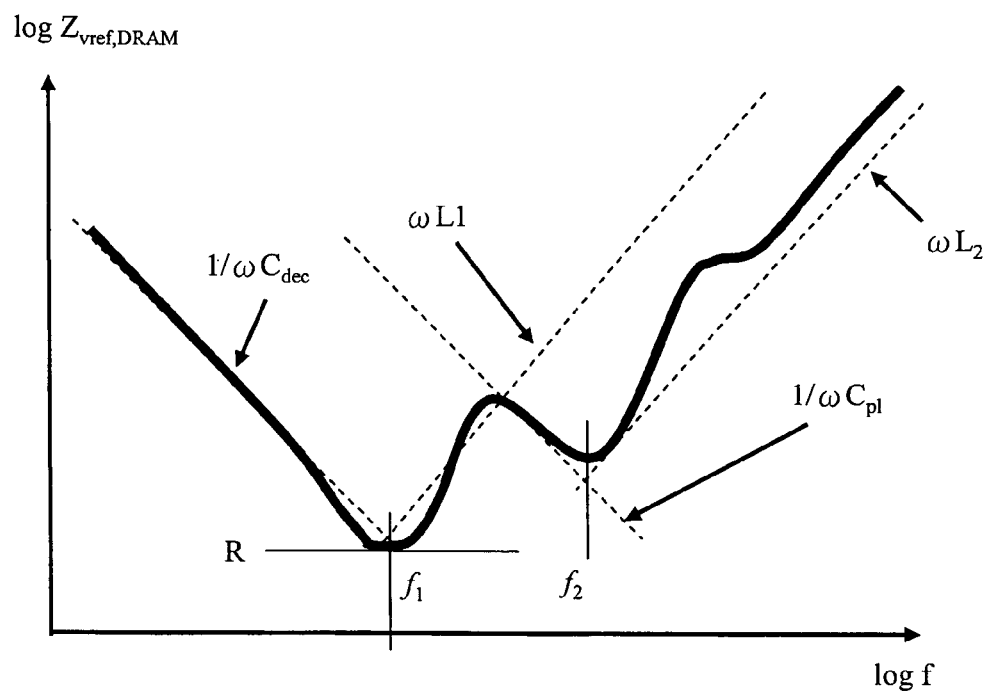
FIG. 4 is an explanatory graph showing an impedance profile between a Vref pin and a Vss pin in the memory module according to the first embodiment of the present invention.

An impedance profile where two RLC circuits are connected in parallel takes a W-shaped impedance profile having two resonant frequencies (f1, f2), as shown in FIG. 4. The first resonant frequency f1 is determined according to the decoupling capacitor.

When typical numerical values are applied to parameters, the resonant frequency f1 becomes about 5 MHz. The resonant frequency f1 can change by one digit according to a value of inductance or capacitance, so that the resonant frequency f1 generally reaches about several MHz to several tens MHz. Similarly, the resonant frequency f2 of the Vref plane becomes about 10 GHz. In general, the resonant frequency f2 becomes 1 GHz to 10 GHz. Thereby, impedance from several MHz to level or order of GHz can be held down, which results in self noise reduction.

Figure 6:
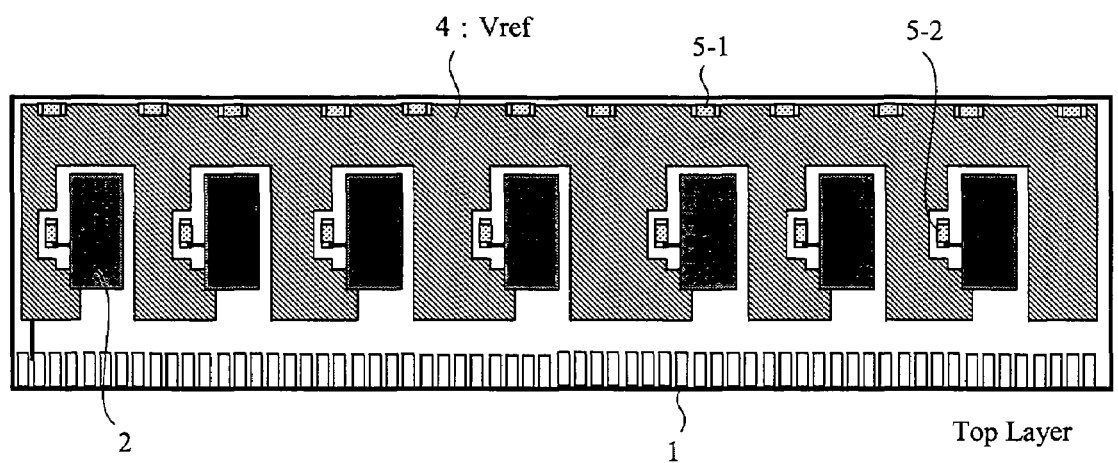
FIG. 6 is an explanatory view of a conventional plane feeding system that is compared with the memory module according to the first embodiment of the present invention.
Figure 7:
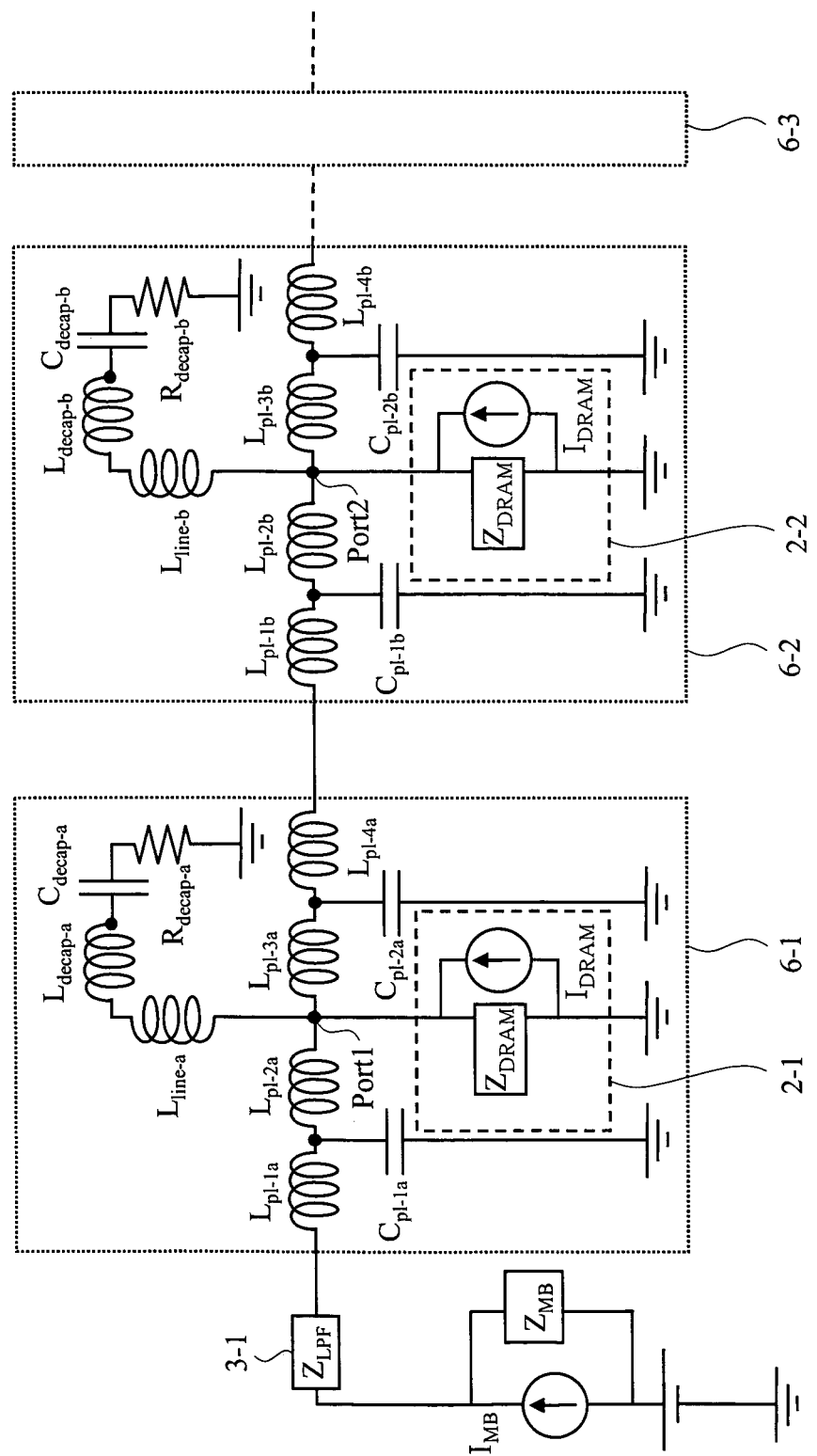
FIG. 7 is an explanatory diagram showing a simplified equivalent circuit of the conventional plane feeding system that is compared with the memory module according to the first embodiment of the present invention.
Figure 9:
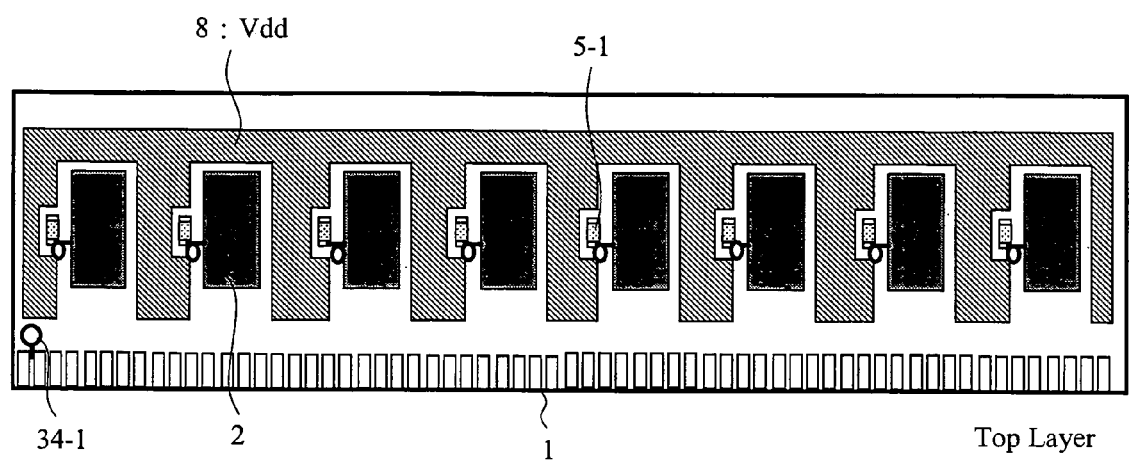
FIG. 9 is an explanatory view of a conventional wire feeding system which is compared with the memory module according to the first embodiment of the present invention.
Figure 9:
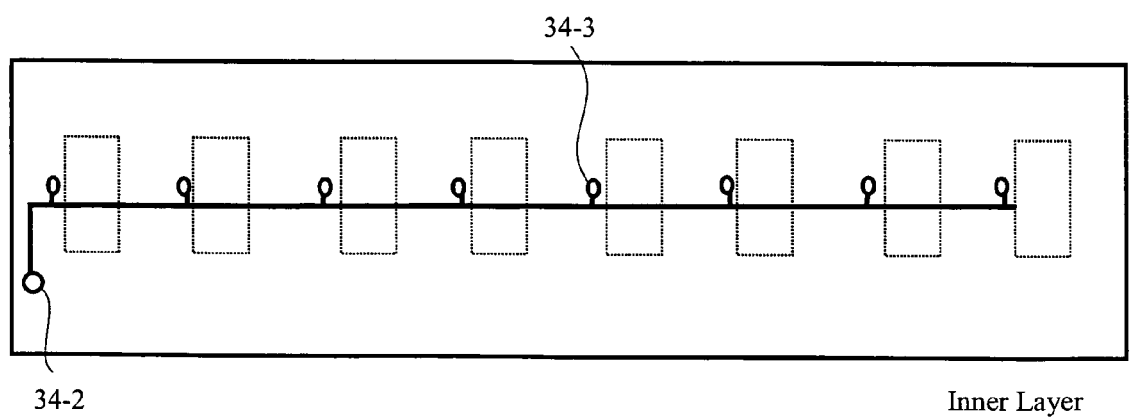
Figure 10:
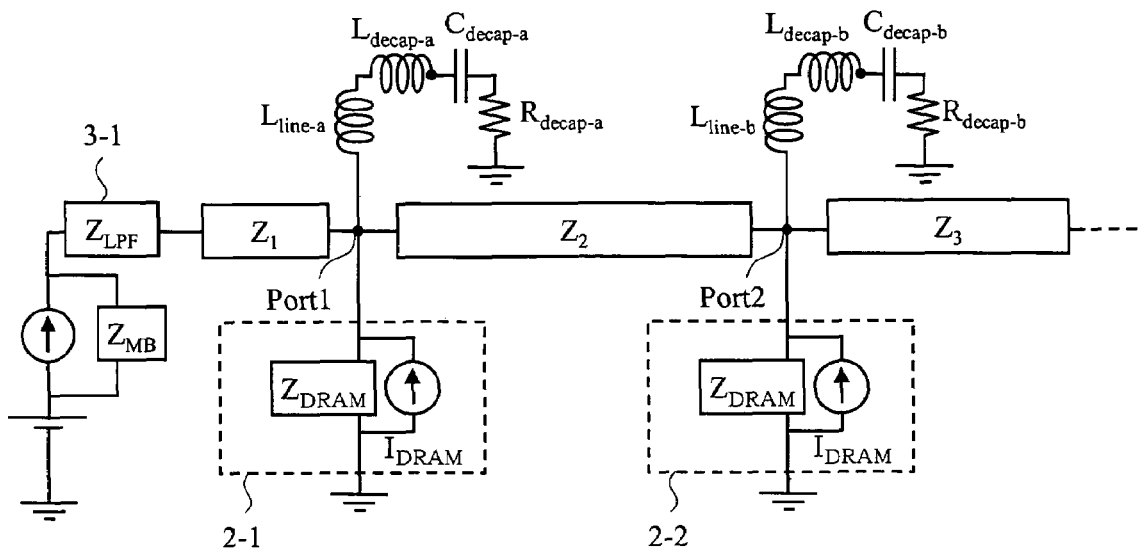
FIG. 10 is an explanatory diagram showing a simplified equivalent circuit of the conventional wire feeding system which is compared with the memory module according to the first embodiment of the present invention.
Figure 11:
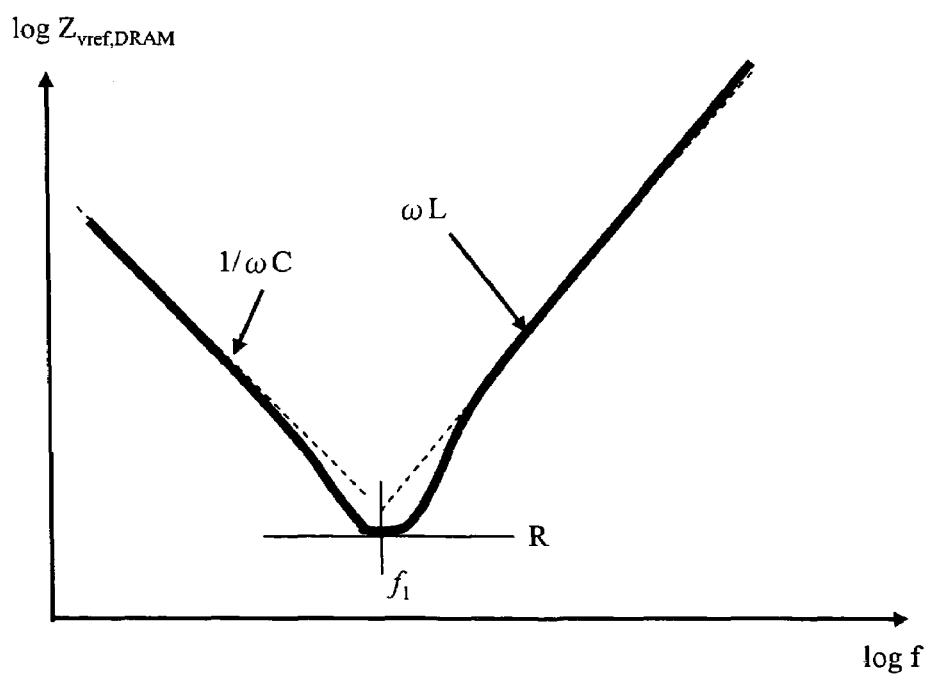
FIG. 11 is an explanatory graph showing an impedance profile between a Vref pin and a Vss pin in the conventional wire feeding system, which is compared with the memory module according to the first embodiment of the present invention.

This system can also achieve the same effect or advantage in the conventional plane feeding system. FIG. 6 shows a plan view of a module adopting the system and FIG. 7 shows an equivalent circuit thereof. On the other hand, in the conventional wire feeding system, such noise reduction can be performed. As shown in FIG. 9, Vref is supplied to respective memories through wires 34-3 and a surface of the TOP layer is used for power source (Vdd) in the wire feeding system. An equivalent circuit in this case is shown in FIG. 10, where, because noise reduction is performed by only the decoupling capacitor, low impedance can be achieved at a low frequency range as shown in FIG. 11 but impedance becomes high in a high frequency range, so that high frequency noise reduction can not be achieved. Accordingly, the self noise can not be reduced sufficiently.

Next, (2) propagation noise is considered.

The propagation noise can be achieved by reducing transfer impedance Z21 of a route from one memory to another memory. In two port transmission route, the transfer impedance is defined as Z21=V2 (an output voltage of port 2)/I1 (an input current to port 1).

Figure 8:
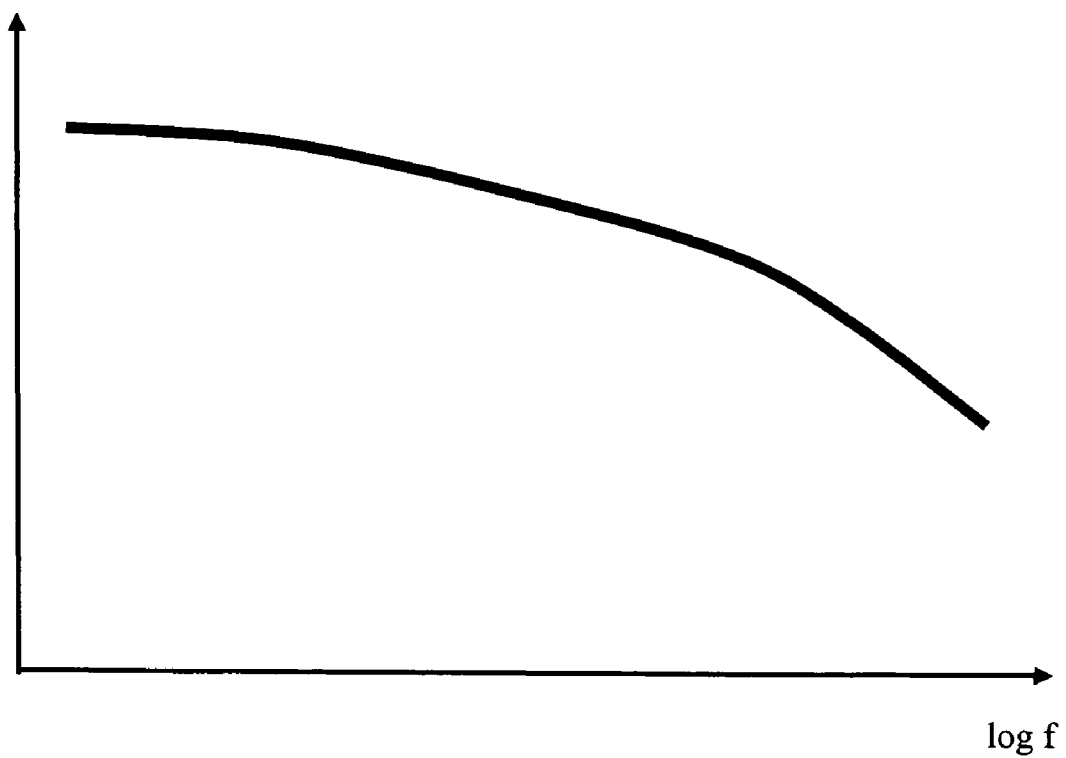
FIG. 8 is an explanatory graph showing a profile of transfer impedance between Port 1 and Port 2 in the conventional art, which is compared with the memory module according to the first embodiment of the present invention.

In the conventional plane feeding system, since respective memories are connected utilizing a Vref plane with a low impedance, propagation loss becomes large (FIG. 8). Even in the conventional wire feeding system, since an impedance of a propagation route is higher than that of the Vref plane but respective memories are connected using impedance wires with a constant width, characteristic impedance is even, and the propagation loss does not reach that of the Vref plane but is relatively low, so that Z21 becomes still large. Therefore, sufficient reduction of the propagation noise can not be achieved in the conventional art.

Reduction of Z21 for reducing the propagation noise can be achieved by constituting a portion of the propagation route between memories with a high impedance material. The best way to achieve the reduction is to insert a resistor having high resistance in the propagation route. $R_{cut-}^*$ shown in FIG. 3 is a resistor which allows the reduction. By inserting a resistor having impedance sufficiently larger than that between Vref and Vss seen from Port 2, impedance of Port 2 seen from Port 1 is made large, so that inflow of noise current into Port 2 becomes hard. As a result, Z21 becomes small. In an ordinary power source line, potential drop takes place due to presence of a resistor, which is not desirable. However, since input of a memory has High-Z (high impedance), current hardly flows in a Vref line, where high resistance is not problematic. Therefore, a resistor having very high resistance (>1 kΩ) may be inserted.

A resistance value can be determined basically so as to be sufficiently large as compared with impedance between Vref and Vss of a memory mounted on a module. Since the impedance between Vref and Vss has frequency characteristic, the impedance is observed in an operationally noteworthy frequency range (up to about several times an ordinary clock frequency), so that a resistance of 5 to 10 times the observed maximum value can be inserted. It is more preferable that the impedance profile of a current route is regarded as a LCR series circuit and a resistor having a resistance value which can reduce propagation noise is inserted. The resistance can be calculated based upon an impedance $L_{tran}$ of a route from port 1 to port 2 and capacitance $C_{dec}$ of the decoupling capacitor by the following equation mainly.

$$R \geq 2\sqrt{\frac{L_{tran}}{C_{dec}}}$$ [Equation 8]

A resistor satisfying the above conditions can be inserted.

This is a condition for so-called over-damping of a RLC series circuit. This is a condition for satisfying a parameter indicating circuit quality (Quality Factor) Q<½, and is such a condition that resonant impedance generated by combination of electric circuit constants of the propagation route does not cause damped oscillation. By conducting selection so as to satisfy the condition of the larger one of the resistance determined by the impedance between the Vref and Vss and the resistance for the over-damping condition described above, noise in the propagation route can be reduced as much as possible. Incidentally, when propagation noise with high frequency should be especially reduced, inductance (due to chip inductance or meander wiring) can be used instead of the resistance. In that case, however, the condition for the over-damping can not be satisfied. Incidentally, the resistor is mounted on a central portion of the Vref plane in FIG. 1, but since it is desirable to elongate the Vref noise propagation route basically (which results in difficulty in noise propagation), the resistor is preferably disposed at the central portion of the Vref plane or a portion slightly lower than the central portion of the Vref plane rather than an upper portion thereof.

Figure 5:
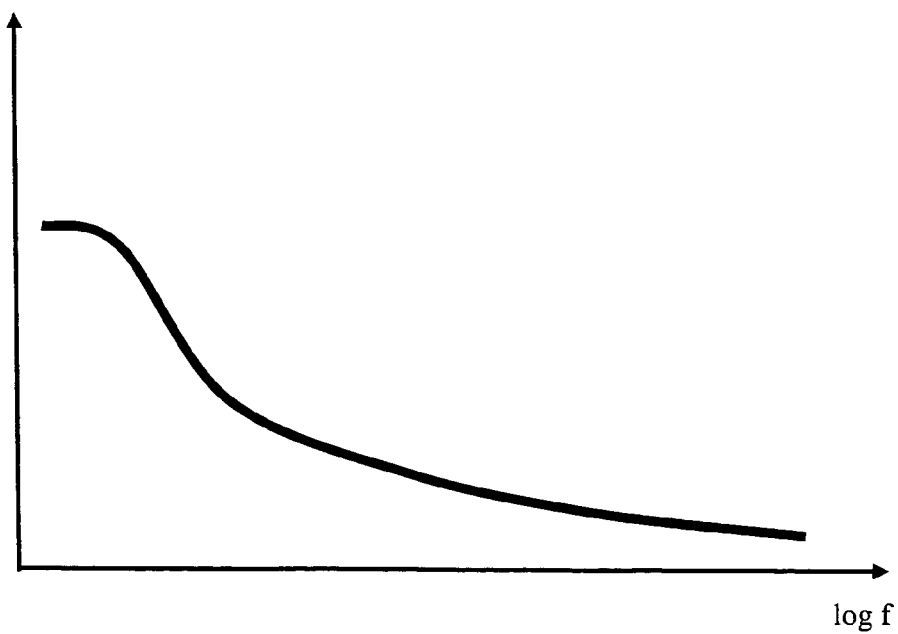
FIG. 5 is an explanatory graph showing a profile of transfer impedance between Port 1 and Port 2 shown in FIG. 3 in the memory module according to the first embodiment of the present invention.

The Z21 obtained by such a method becomes small, as shown in FIG. 5, so that the propagation noise can be reduced.

As explained above, the Vref wiring system realized according to the present invention is effective for (1) the self noise reduction and (2) the propagation noise reduction. Incidentally, by inserting the LPF or the high impedance part of a high chip resistor 3-1, as shown in FIG. 1, the propagation noise from the motherboard is minimized, so that a system where Vref noise has been reduced in all aspects can be realized.

Second Embodiment

Figure 12:
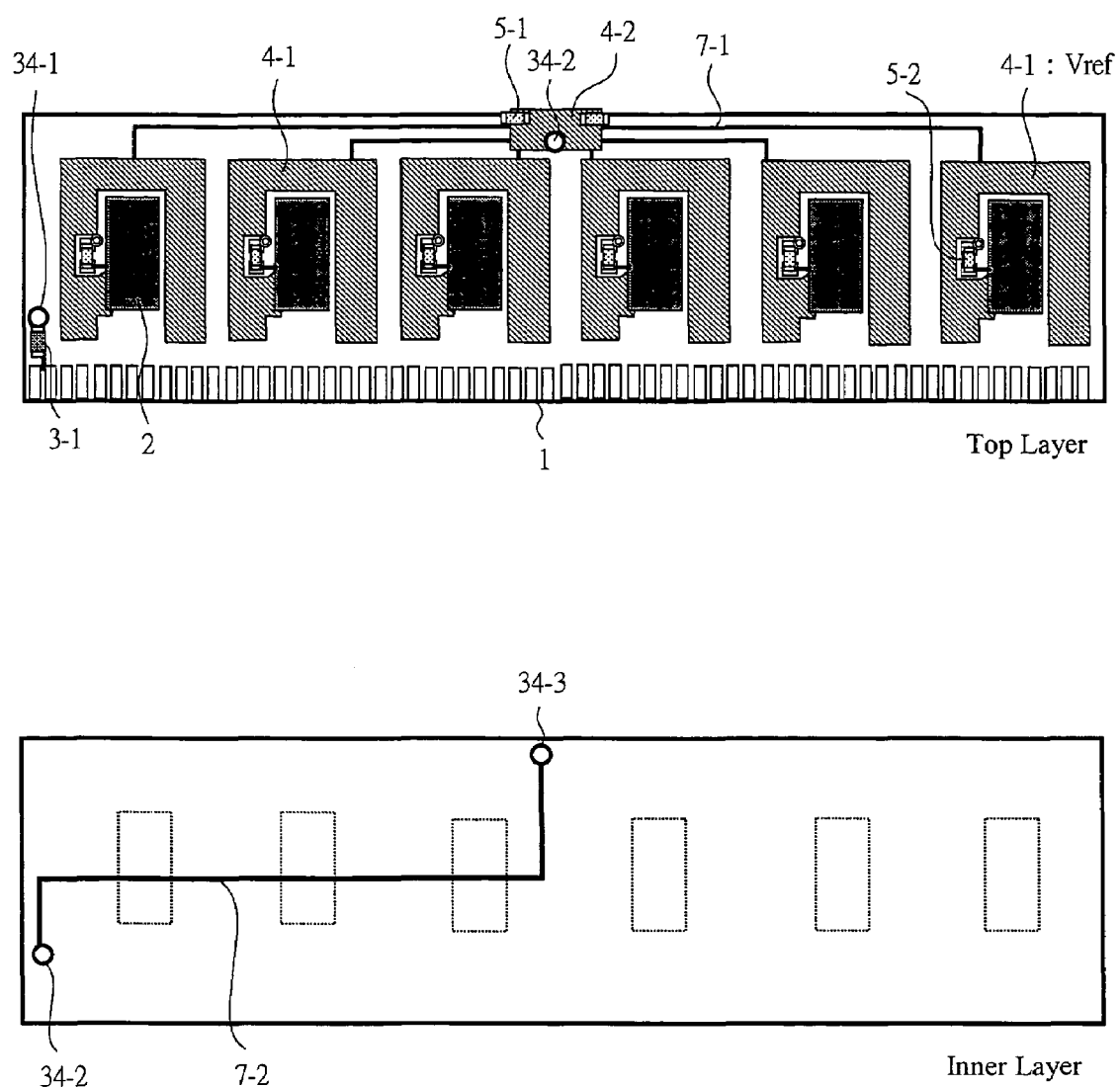
FIG. 12 is an explanatory view of a wiring system of Vref external application+star topology in a memory module according to a second embodiment of the present invention.

One example of a memory module according to a second embodiment will be explained with reference to FIG. 12.

In the second embodiment, a star type is adopted as a method for connecting Vref planes which are possessed by respective memories. The second embodiment can reduce propagation noise more than the first embodiment, and it has a disadvantage that a broad Vref wiring area is required for the TOP layer and an inner layer.

A wiring method will be explained. A Vref wire from a connector portion is connected to a high impedance chip part 3-1 of LPF shown in FIG. 12, and after passing through the LPF, the Vref wire drops in an inner layer at a Via 34-1. The Vref wire extends from a Via 34-2 to a central portion of a module on a Vref wiring layer which is the inner layer using a wire 7-2 and it is returned back to the TOP layer at an upper portion of the inner layer through Via again. The Vref which has reached the TOP layer at the Via 34-3 is connected to a Vref plane 4-2. A decoupling capacitor 5-1 is mounted on the Vref plane 4-2, so that the Vref plane 4-2 is put in low impedance. The Vref plane 4-2 is connected to Vref planes of respective memories 2 via thin wires 7-1. Each of the memories 2 is designed to have a low impedance owing to the Vref plane 4-1 on the TOP layer and a decoupling capacitor 5-2, so that self noise thereof is reduced.

The propagation noise passes through the Vref 4-2 necessarily. However, since the Vref 4-2 is designed to have low impedance using the decoupling capacitor 5-1 and connection to respective portions is performed using thin wires with a high impedance, the propagation noise is hardly propagated. In FIG. 12, the Vref plane 4-2 is arranged at a central portion of the module. The arrangement is based upon wiring easiness, because wiring to the respective memories is conducted utilizing a star type topology. The Vref plane 4-2 is not required to be arranged at the central portion necessarily due to a wiring layout on a module. The Vref plane 4-2 may be divided to a plurality of pieces and wiring can be performed to the respective pieces.

Third Embodiment

Figure 13:
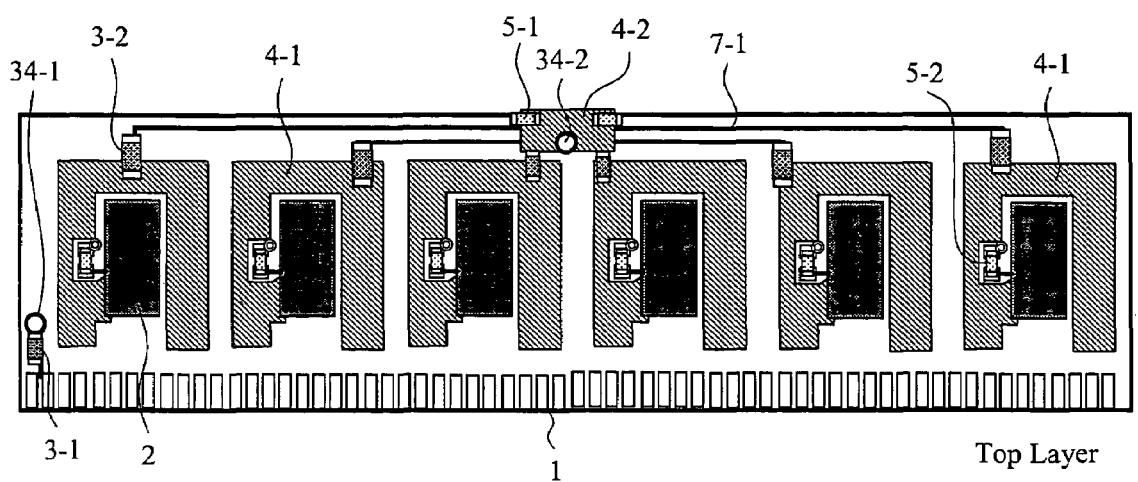
FIG. 13 is an explanatory view of a wiring system of Vref external application+star topology+high impedance part in a memory module according to a third embodiment of the present invention.
Figure 13:
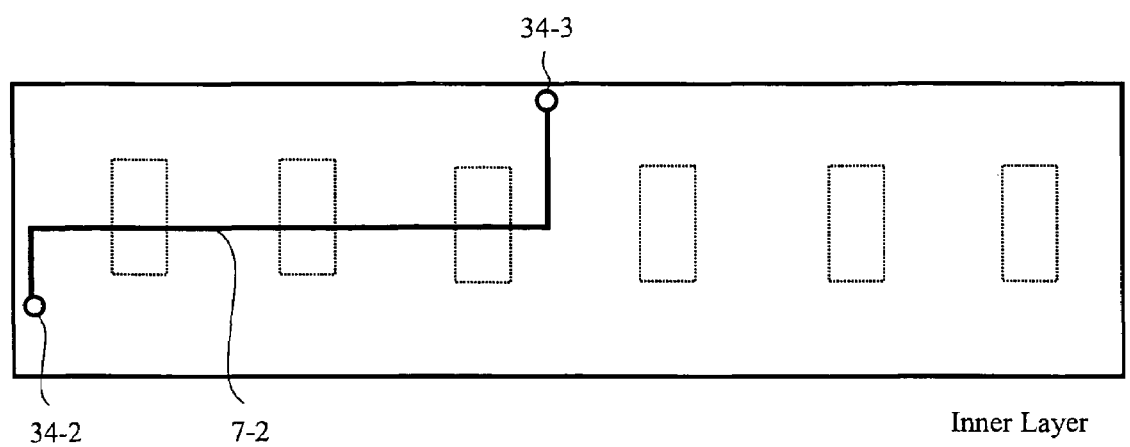

One example of a memory module according to a third embodiment will be explained with reference to FIG. 13.

The third embodiment has such a constitution that high impedance chip parts 3-2 are added in the propagation routes to respective memories in the second embodiment. The third embodiment can reduce more propagation noise than the second embodiment, but it includes such a disadvantage that broad Vref wiring areas are required in the TOP layer and the inner layer and the number of parts increases. Though the high impedance chip part 3-2 can be arranged at any mounting position, since there is a possibility that noise, such as crosstalk on another signal line, superimposed on propagation noise propagates on the Vref 7-1 on the TOP layer, it will be the best way to arrange the high impedance chip part 3-2 at a root of a connection portion of each memory to the Vref plane, as shown in FIG. 13. By adopting such a constitution, noise coming outside the Vref plane must pass through the high impedance chip part 3-2 where the noise can be reduced.

Fourth Embodiment

Figure 14:
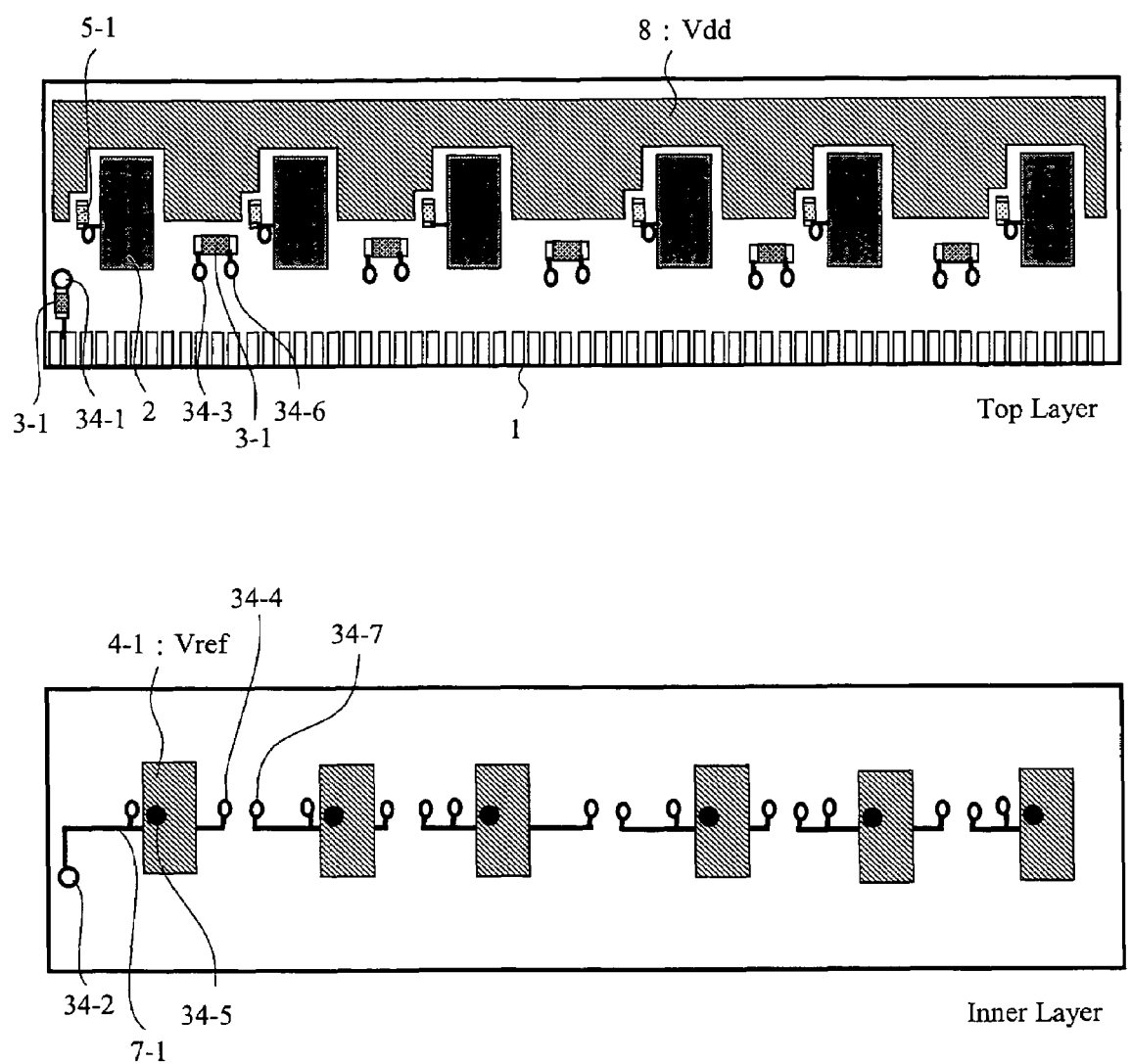
FIG. 14 is an explanatory view of a wiring system of Vref external application+wire feeding+high impedance part in a memory module according to a fourth embodiment of the present invention.

One example of a memory module according to a fourth embodiment will be explained with reference to FIG. 14.

The fourth embodiment is an improved one of conventional wire feeding system, where one layer of inner layers is prepared for Vref wiring so that propagation noise is reduced as much as possible.

A wiring method will be explained. A Vref wire from a connector portion is connected to a high impedance chip part 3-1 of an LPF shown in FIG. 14, and after passing through the LPF, it is connected to an inner layer at a Via 34-1. The Vref wire is connected on a Vref layer which is the inner layer from the Via 34-2 to a Vref plane 4-1 prepared just below a mounting position of a first memory by a wire 7-1. The Vref plane 4-1 is connected to a Vref line of a memory through a Via 34-5 connected to a portion of the memory positioned near a Vref pin at a low impedance. A decoupling capacitor 5-1 for Vref is mounted on a TOP layer, and it is connected to the Vref pin of the memory by a wire. Respective memories are each provided with the Vref plane of the inner layer and the decoupling capacitor in this manner, so that low impedance design is achieved and self-noise is reduced.

Wiring to the next memory is conducted using a wire of an inner layer. Incidentally, a Via 34-4 is provided in an intermediate portion of the wire, and it is connected to the TOP layer. A high impedance chip part is mounted on the TOP layer, so that propagation noise is cut off. Reference numeral 8 on the TOP layer denotes a Vdd plane. The high impedance chip part is preferably a resistor like the first embodiment. The condition required for the resistor is similar to that in the first embodiment.

Since the wiring system according to the fourth embodiment reduces more propagation noise than those according to the first to third embodiments, and the inductance between the Vref plane in the inner layer and the memory becomes very small, it is very effective for high frequency noise reduction. Incidentally, the wiring system according to the fourth embodiment has such a drawback that the total number of modules increases, because almost all one layer of the inner layers is used for the Vref wiring and the Vref plane.

Fifth Embodiment

The first to fourth embodiments adopt the low noise wiring system in the system where a Vref voltage is supplied from a motherboard. Fifth to eighth embodiments are for realizing a wiring system utilized when Vref is generated inside a module. Basically, the fifth to eighth embodiments have a constitution that the thought (Vref is supplied externally) in the first to fourth embodiments is replaced with Vref internal generation. Here, the Vref internal generation means that, since Vref generally has a voltage value of ½ of a power source voltage Vdd of a memory, it is generated by performing Thevenin's termination on Vdd and Vss in the module. Here, the Thevenin's termination means connecting of Vref wire (plane) to Vdd and Vss respectively using two resistors having the same resistance.

Figure 15:
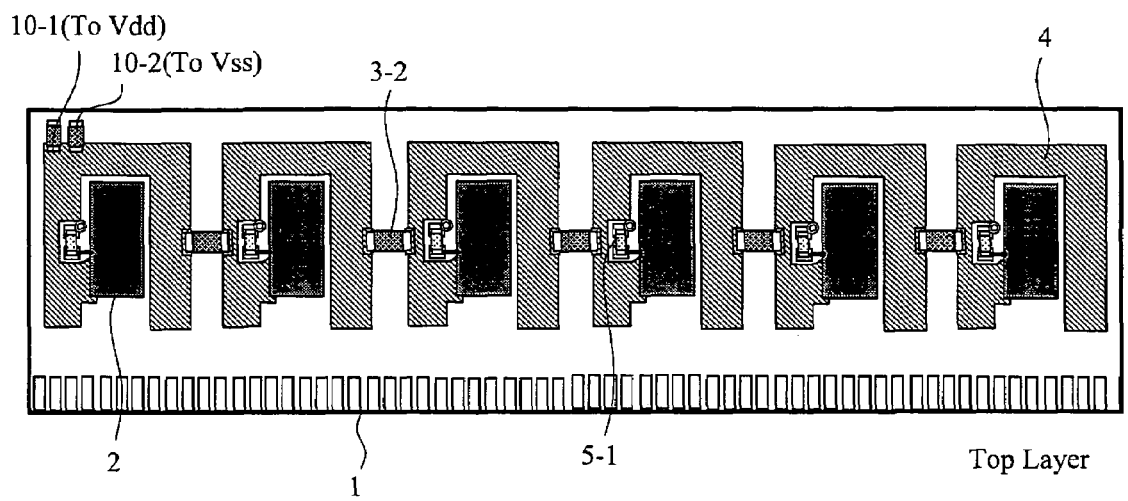
FIG. 15 is an explanatory view of a wiring system of Vref internal generation+plane cascade connection+high impedance part in a memory module according to a fifth embodiment of the present invention.

One example of a memory module according to the fifth embodiment will be explained with reference to FIG. 15.

The fifth embodiment has a constitution that the first embodiment is modified for Vref internal generation. The fifth embodiment is different from the first embodiment in that there is not any wire from a motherboard and two chip resistors for Vref generation (10-1, 10-2) are mounted in the former. In FIG. 15, Vref is generated at a Vref plane of the leftmost memory, but it can be generated at a Vref plane of any memory.

Sixth Embodiment

Figure 16:
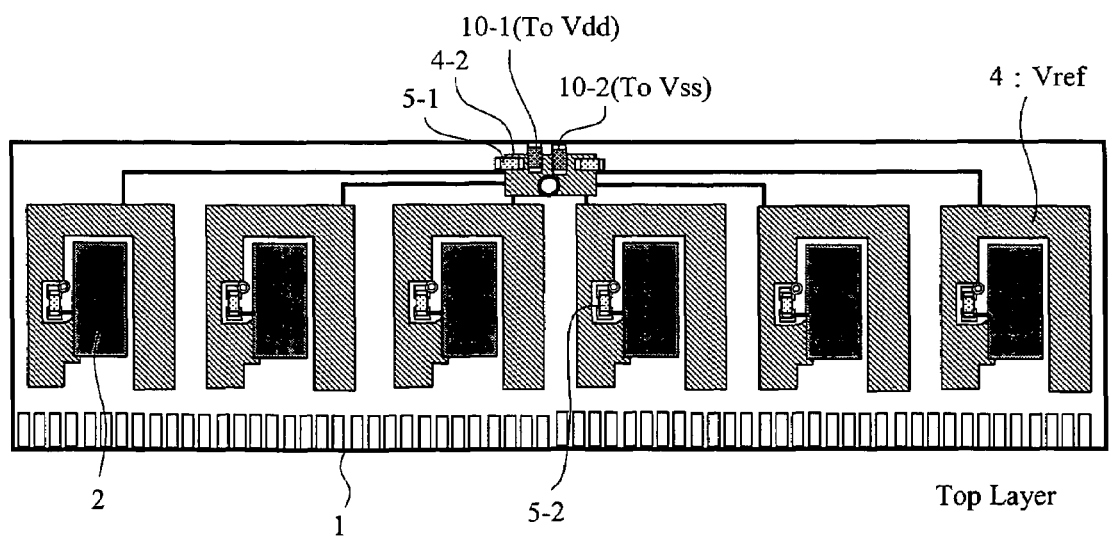
FIG. 16 is an explanatory view of a wiring system of Vref internal generation+star topology in a memory module according to a sixth embodiment of the present invention.

One example of a memory module according to the sixth embodiment will be explained with reference to FIG. 16.

The sixth embodiment has a constitution that the second embodiment is modified for Vref internal generation. The sixth embodiment is different from the second embodiment in that there is not any wire from a motherboard (therefore, there is not a Vref wire of the inner layer) and two chip resistors for Vref generation (10-1, 10-2) are mounted on the Vref plane 4-2 in the former.

Seventh Embodiment

Figure 17:
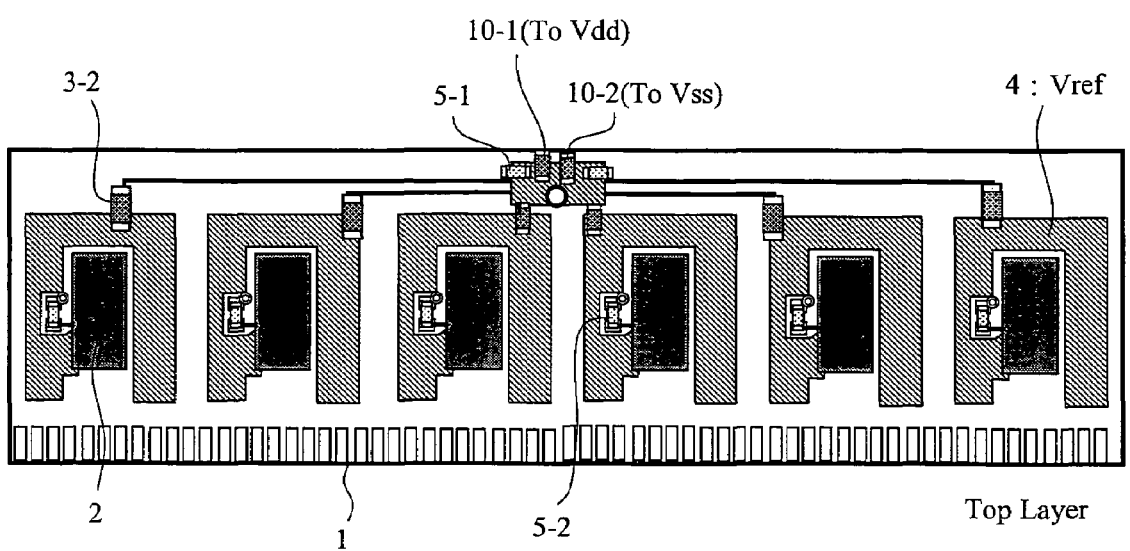
FIG. 17 is an explanatory view of a wiring system of Vref internal generation+star topology+high impedance part in a memory module according to a seventh embodiment of the present invention.

One example of a memory module according to the seventh embodiment will be explained with reference to FIG. 17.

The seventh embodiment has a constitution that the second embodiment is modified for Vref internal generation. The seventh embodiment is different from the third embodiment in that there is not any wire from a motherboard (therefore, there is not a Vref wire of the inner layer) and two chip resistors for Vref generation (10-1, 10-2) are mounted on the Vref plane 4-2 in the former. This may also be understood to have such a constitution that the high impedance chip part 3-2 is added to the Vref wiring in the sixth embodiment.

Eighth Embodiment

Figure 18:
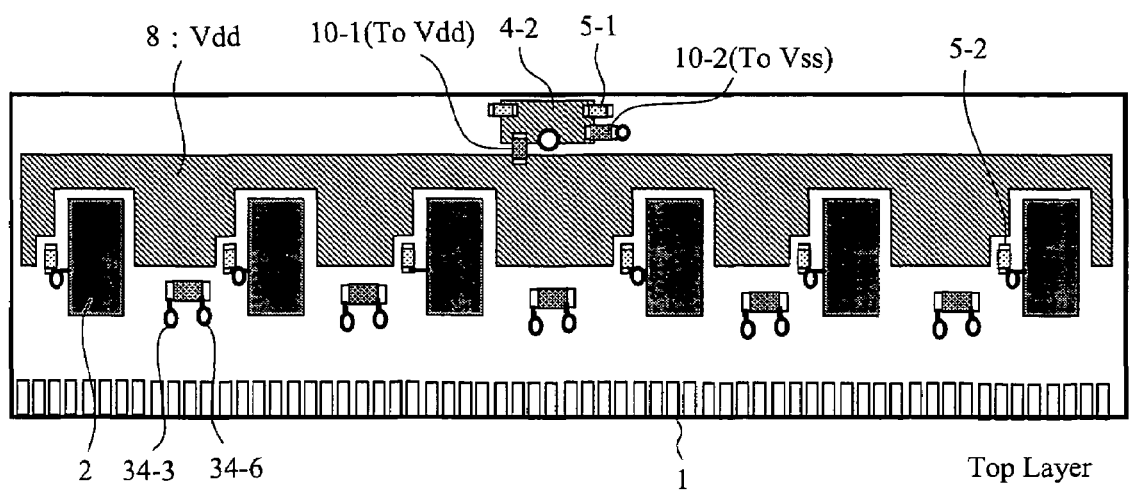
FIG. 18 is an explanatory view of a wiring system of Vref internal generation+wire feeding+high impedance part in a memory module according to an eighth embodiment of the present invention.
Figure 18:
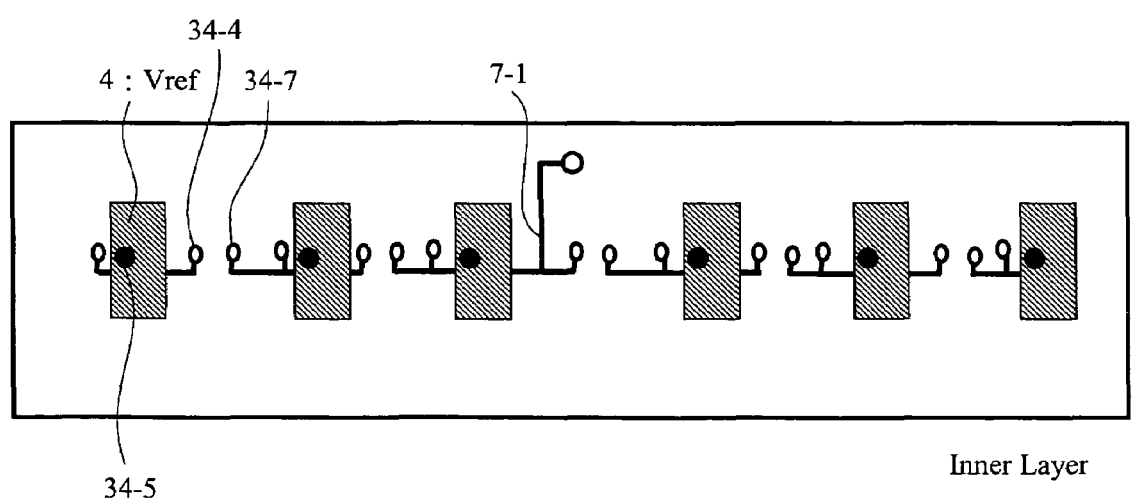

One example of a memory module according to the eighth embodiment will be explained with reference to FIG. 18.

The eighth embodiment has a constitution that the fourth embodiment is modified for Vref internal generation. The eighth embodiment is different from the fourth embodiment in that there is not any wire from a motherboard, and that the Vref plane 4-2 for Vref generation is provided on the TOP layer, two chip resistors for Vref generation (10-1, 10-2) and the decoupling capacitor 5-1 are mounted on the Vref plane 4-2, and wires extend from the Vref plane 4-2 to respective memories. In FIG. 18, though the Vref plane for Vref generation is disposed at a central and upper portion of the TOP layer, it may be arranged on the inner layer and it is unnecessary to arrange the Vref plane for Vref generation at the central portion necessarily.

Ninth Embodiment

Ninth to fourteenth embodiments show examples where one of the wiring systems according to the first to eighth embodiments is applied to a module having a register or buffer. Here, the register or the buffer is a chip for accumulating an addresses, clocks, or data signals transferred from a motherboard to the module to distribute them in the module in order to stabilize behavior of a memory speeded up.

Figure 19:
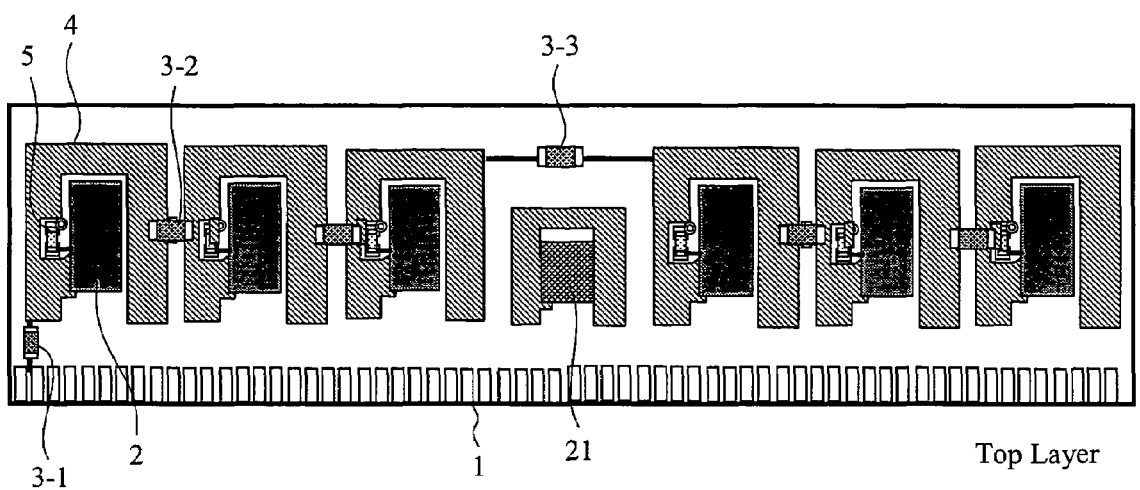
FIG. 19 is an explanatory view of a wiring system of Vref external application+plane cascade connection+high impedance part when a register or a buffer is mounted on a memory module according to a ninth embodiment of the present invention.

One example of a memory module according to the ninth embodiment will be explained with reference to FIG. 19.

The ninth embodiment is obtained by modifying the first embodiment for a module having a register or a buffer. The ninth embodiment is different from the first embodiment in that a wire is used for Vref in the vicinity of a central register or buffer 21 including many noise factors instead of a plane in the former and a high impedance chip 3-3 is interposed in the wire to cut off noise.

Tenth Embodiment

Figure 20:
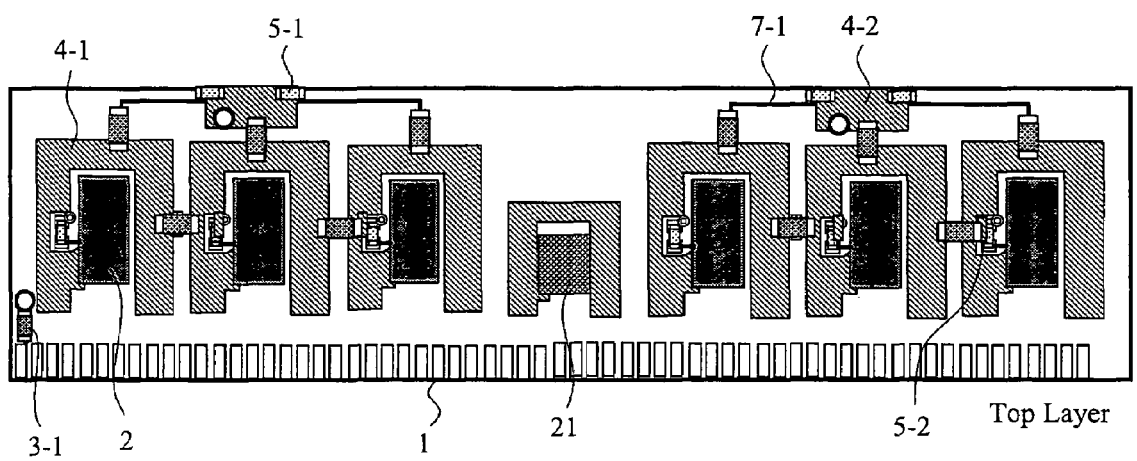
FIG. 20 is an explanatory view of a wiring system of Vref external application+star topology+high impedance part when a register or a buffer is mounted on a memory module according to a tenth embodiment of the present invention.
Figure 20:
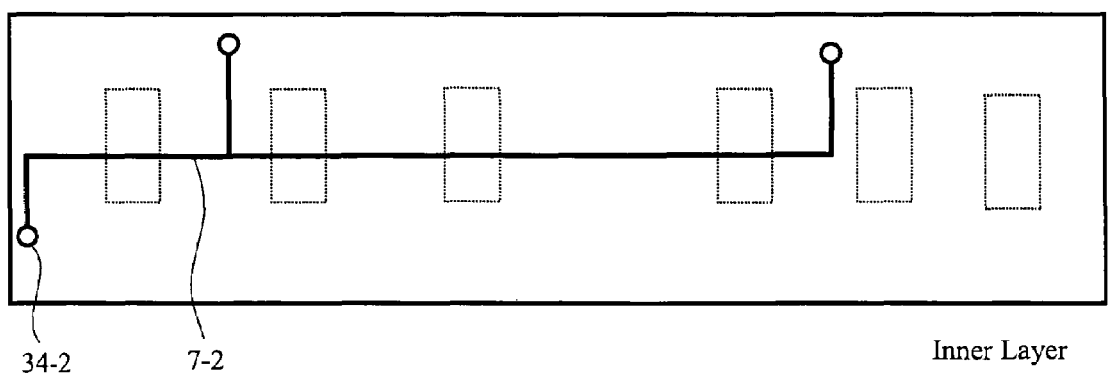

One example of a memory module according to the tenth embodiment will be explained with reference to FIG. 20.

The tenth embodiment is obtained by modifying the third embodiment for a module having a register or a buffer. The tenth embodiment is different from the third embodiment in that a Vref plane is not provided in the vicinity of the central register or buffer 21 including many noise factors and Vref planes are respectively provided at central portions of both side portions of the module base plate so that Vref are fed to respective memories. Incidentally, when the second embodiment is modified for a module having a register or buffer, the high impedance parts positioned at the roots of the Vref wires connected to respective memories are removed.

Eleventh Embodiment

Figure 21:
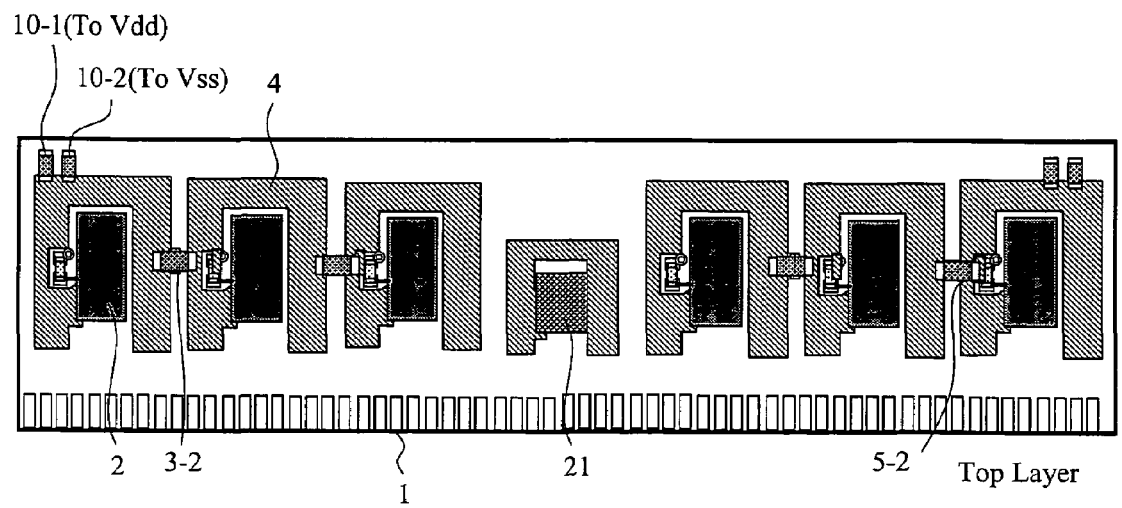
FIG. 21 is an explanatory view of a wiring system of Vref internal generation+plane cascade connection+high impedance part when a register or a buffer is mounted on a memory module according to an eleventh embodiment of the present invention.

One example of a memory module according to the eleventh embodiment will be explained with reference to FIG. 21.

The eleventh embodiment is obtained by modifying the fifth embodiment for a module having a register or a buffer. The eleventh embodiment is different from the third embodiment in that a Vref plane is not provided in the vicinity of the central register or buffer 21 including many noise factors and chip resistors 10-1 and 10-2 for Vref internal generation are mounted on each of Vref planes on both sides. Thereby, since a Vref propagation route is not present in the vicinity of the register or buffer 21, superimposition of noise at the register portion hardly occurs.

Twelfth Embodiment

Figure 22:
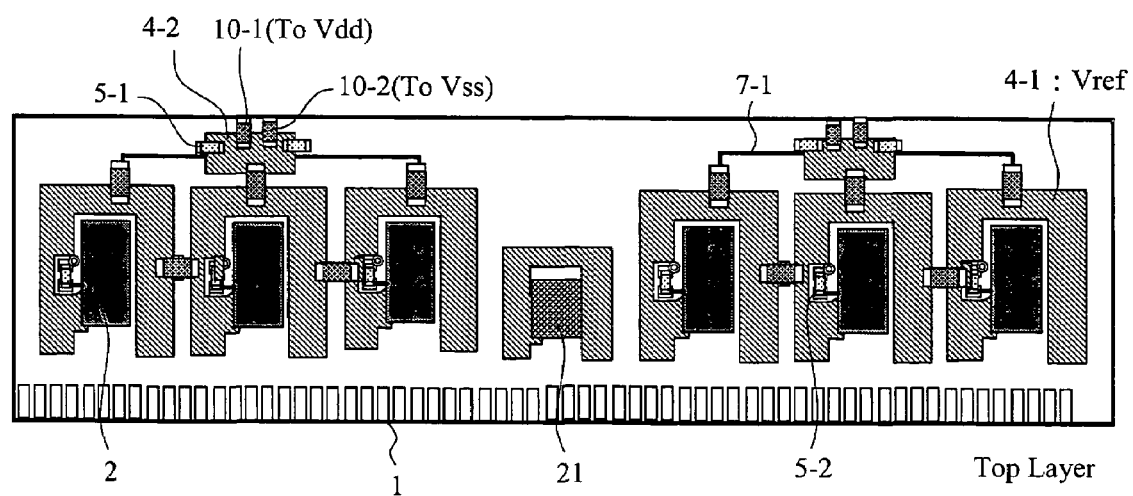
FIG. 22 is an explanatory view of a wiring system of Vref internal generation+star topology+high impedance part when a register or a buffer is mounted on a memory module according to a twelfth embodiment of the present invention.

One example of a memory module according to the twelfth embodiment will be explained with reference to FIG. 22.

The twelfth embodiment is obtained by modifying the seventh embodiment for a module having a register or a buffer. The twelfth embodiment is different from the seventh embodiment in that a Vref plane for Vref generation 4-2 is not provided in the vicinity of the central register or buffer 21 including many noise factors, but Vref planes for Vref generation are respectively arranged at central portions of both sides of the module and chip resistors for Vref internal generation 10-1 and 10-2 are mounted on each of the Vref planes for Vref generations. Thereby, since a Vref propagation route is not present in the vicinity of the register or buffer 21, superimposition of noise at the register portion hardly occurs. Incidentally, when the sixth embodiment is modified for a module having a register or buffer, the high impedance parts positioned at the roots of the Vref wires connected to respective memories are removed.

Thirteenth Embodiment

Figure 23:
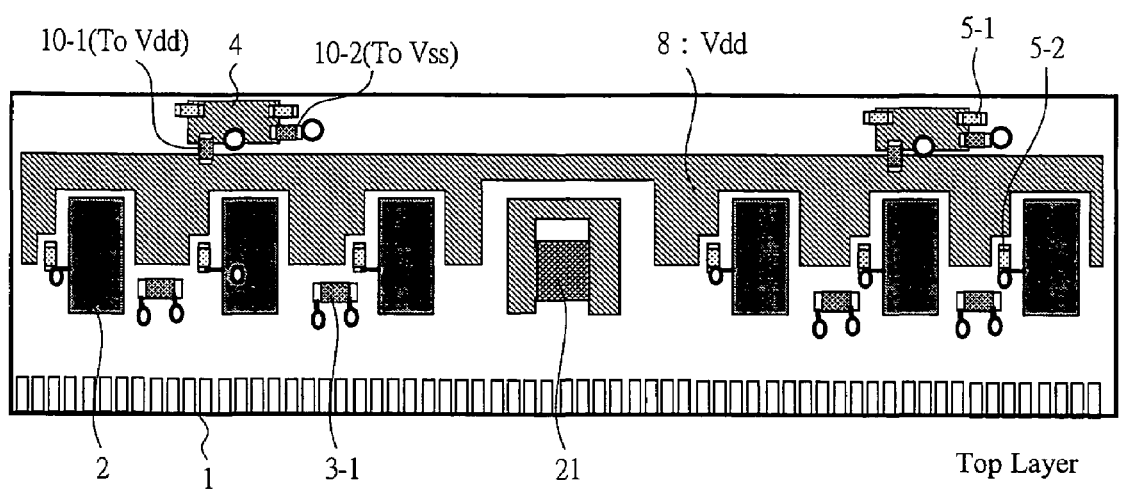
FIG. 23 is an explanatory view of a wiring system of Vref internal generation+wire feeding+high impedance part when a register or a buffer is mounted on a memory module according to a thirteenth embodiment of the present invention.
Figure 23:
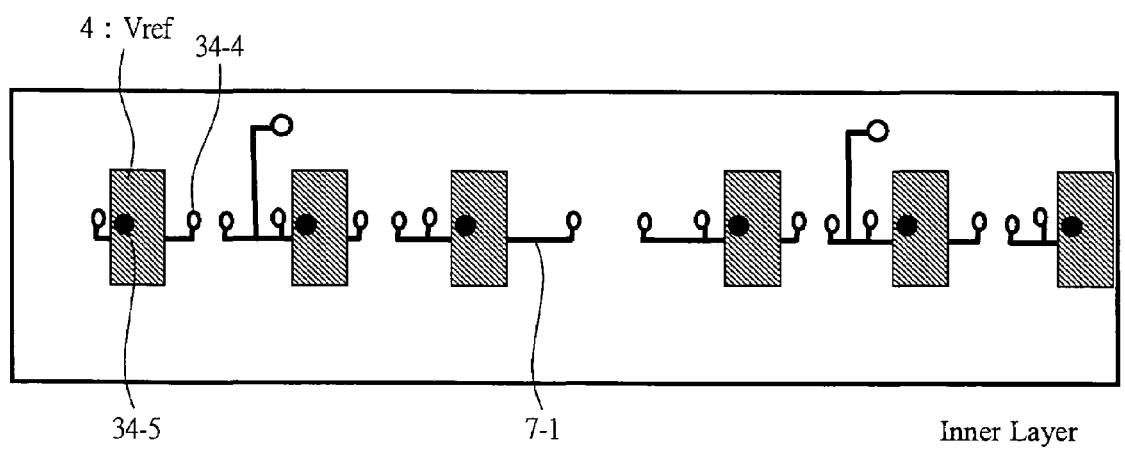

One example of a memory module according to the thirteenth embodiment will be explained with reference to FIG. 23.

The thirteenth embodiment is obtained by modifying the eighth embodiment for a module having a register or a buffer. The thirteenth embodiment is different from the third embodiment in that a Vref plane for Vref generation 4 is not provided in the vicinity of the central register or buffer 21 including many noise factors, but Vref planes for Vref generation are respectively arranged at central portions of both sides of the module and chip resistors for Vref internal generation 10-1 and 10-2 are mounted on each of the Vref planes for Vref generations. Thereby, since a Vref propagation route is not present in the vicinity of the register or buffer 21, superimposition of noise at the register portion hardly occurs.

Fourteenth Embodiment

Fourteenth to twenty-first embodiments are embodiments of the present invention relating to a module of a three-dimensional mounting type where electrical connection between an upper layer and a lower layer is performed using a Via.

Figure 24:
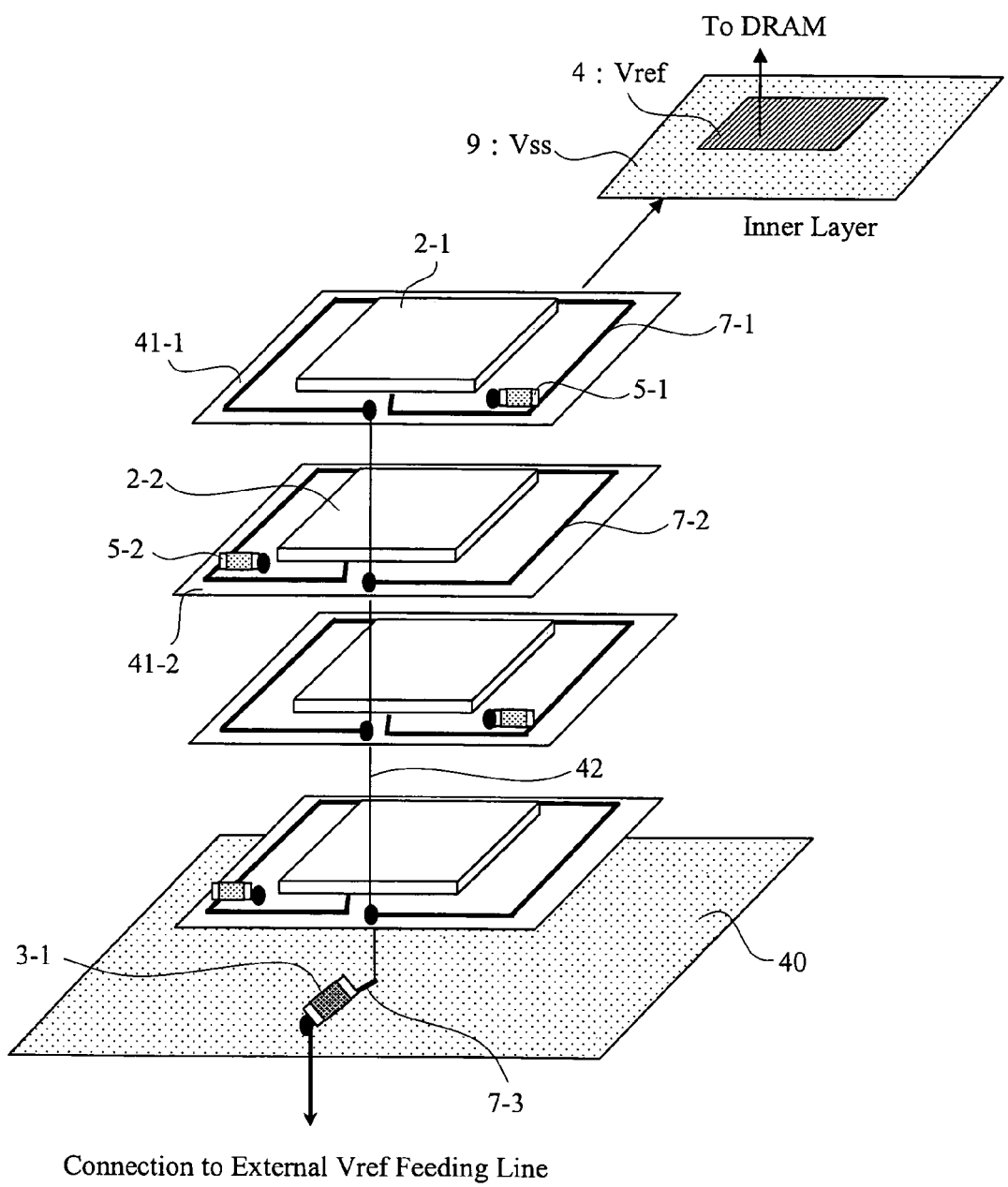
FIG. 24 is an explanatory view of a Vref wiring system 1 in a three-dimensional mounting system in a memory module according to a fourteenth embodiment of the present invention.

One example of a memory module according to the fourteenth embodiment will be explained with reference to FIG. 24.

A module of a three-dimensional mounting type has an interposer 40 as the lowermost layer thereof. The interposer 40 is a Ball Grid Array (BGA) base plate, and it is a base plate for obtaining electrical connection with a motherboard. Transmission of electrical signals to respective memories mounted three-dimensionally is performed through a Via 42. Respective memories 2-1 and 2-2 are respectively mounted on flip-chip packages 41-1 and 41-2, and they are transmitted with various power sources from the flip-chip packages and signals from the Via connected from the interposer.

In the present invention, by arranging a Vref wire 7-1 on a flip-chip base plate which is one of sub-base plates to be stacked so as to surround a chip, a propagation route is elongated, and inductance and resistance are made large, so that propagation noise among respective memories is reduced. By arranging wires on upper and lower flip-chip base plates adjacent to each other in clockwise direction and counter-clockwise direction respectively, even if the wires are positioned adjacent to each other, the propagation route is made very long. When a decoupling capacitor is disposed in the Vref wire on the flip-chip base plate, if possible, self-noise can be reduced significantly. It is further preferable that the Vref plane 4 is arranged on an inner layer of the flip-chip base plate. An inner layer 9 is a Vss plane. A high impedance chip part 3-1 for reducing noise from the motherboard is mounted on the interposer.

Fifteenth Embodiment

Figure 25:
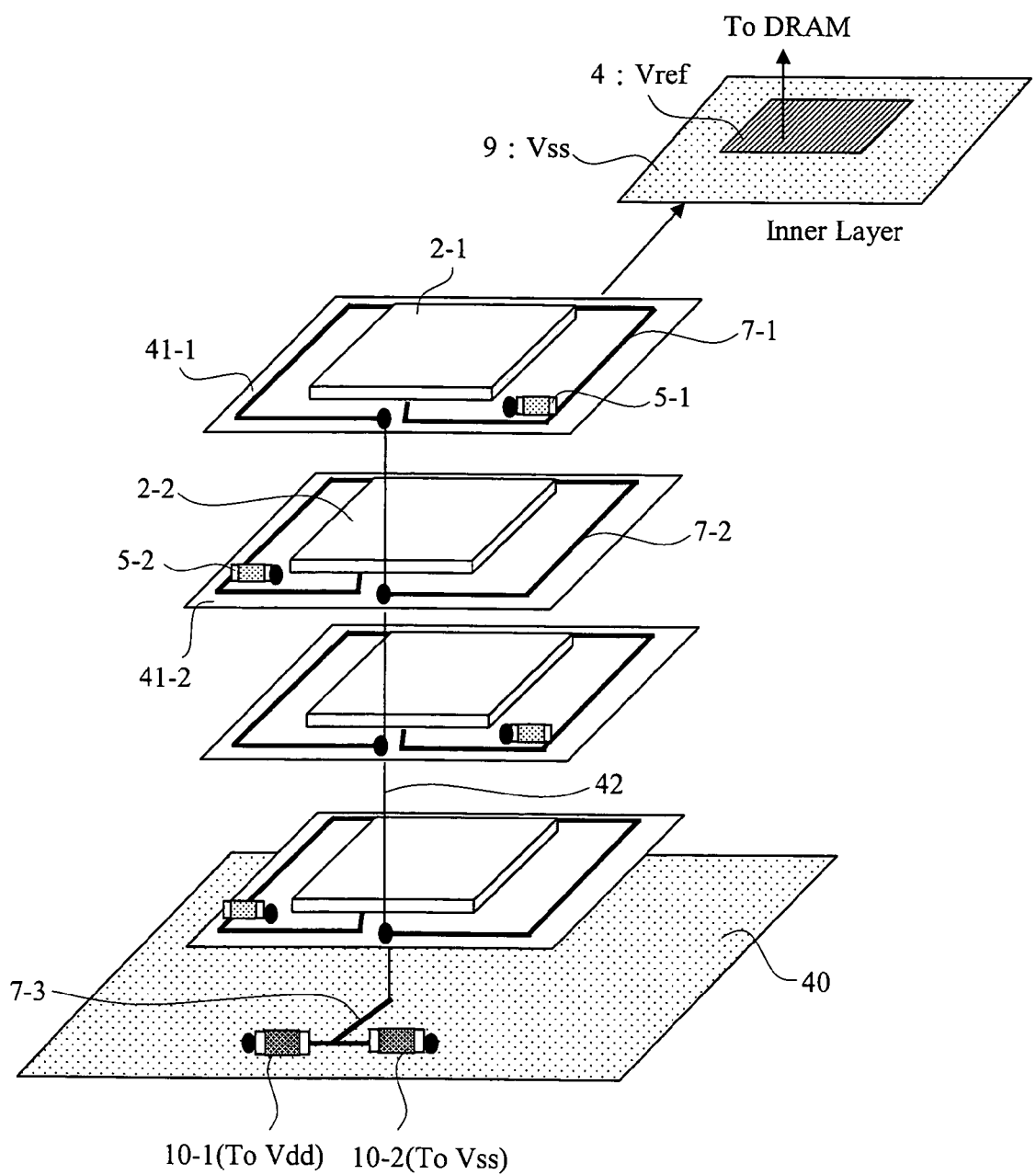
FIG. 25 is an explanatory view of a Vref wiring system 2 in a three-dimensional mounting system in a memory module according to a fifteenth embodiment of the present invention.

One example of a memory module according to the fifteenth embodiment will be explained with reference to FIG. 25.

The fifteenth embodiment has the same wiring constitution as the fourteenth embodiment, but it is mounted with chip resistors 10-1 and 10-2 on the interposer so that Vref feeding is performed by internal generation instead of external feeding.

Sixteenth Embodiment

Figure 26:
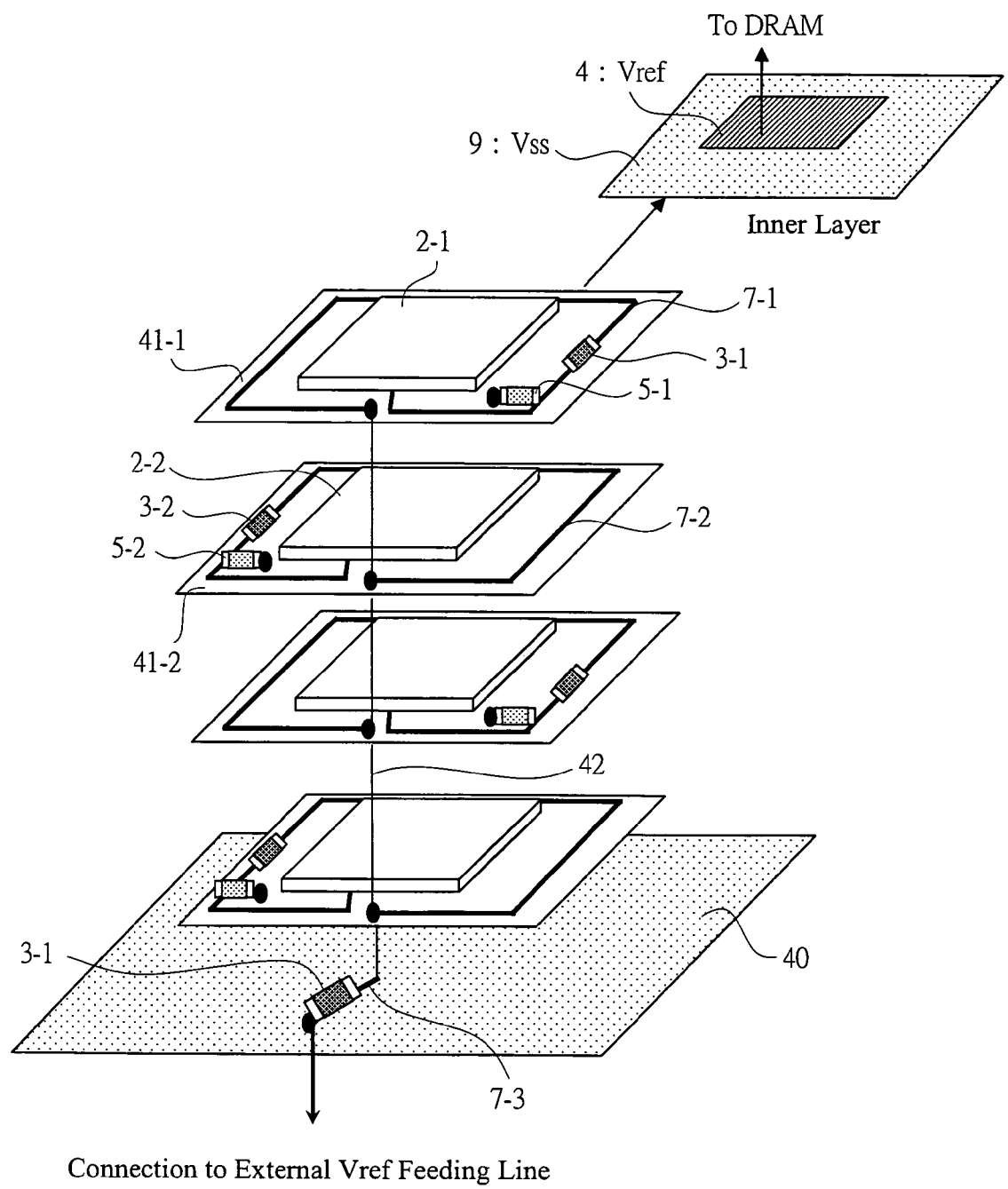
FIG. 26 is an explanatory view of a Vref wiring system 3 in a three-dimensional mounting system in a memory module according to a sixteenth embodiment of the present invention.

One example of a memory module according to the sixteenth embodiment will be explained with reference to FIG. 26.

The sixteenth embodiment has substantially the same wiring constitution as the fourteenth embodiment, but it has high impedance chip parts 3-2 and 3-3 interposed in the Vref wires 7-1 and 7-2 on the flip-chips. Thereby, the sixteenth embodiment can reduce propagation noise further effectively as compared with the fourteenth embodiment, but it includes such a disadvantage that the number of parts increases. Incidentally, the high impedance chip parts are disposed at positions remote farther than the decoupling capacitors 5-1 and 5-2 as seen from the Vref input portions of the memories. Otherwise, effect of the decoupling capacitor is reduced.

Seventeenth Embodiment

Figure 27:
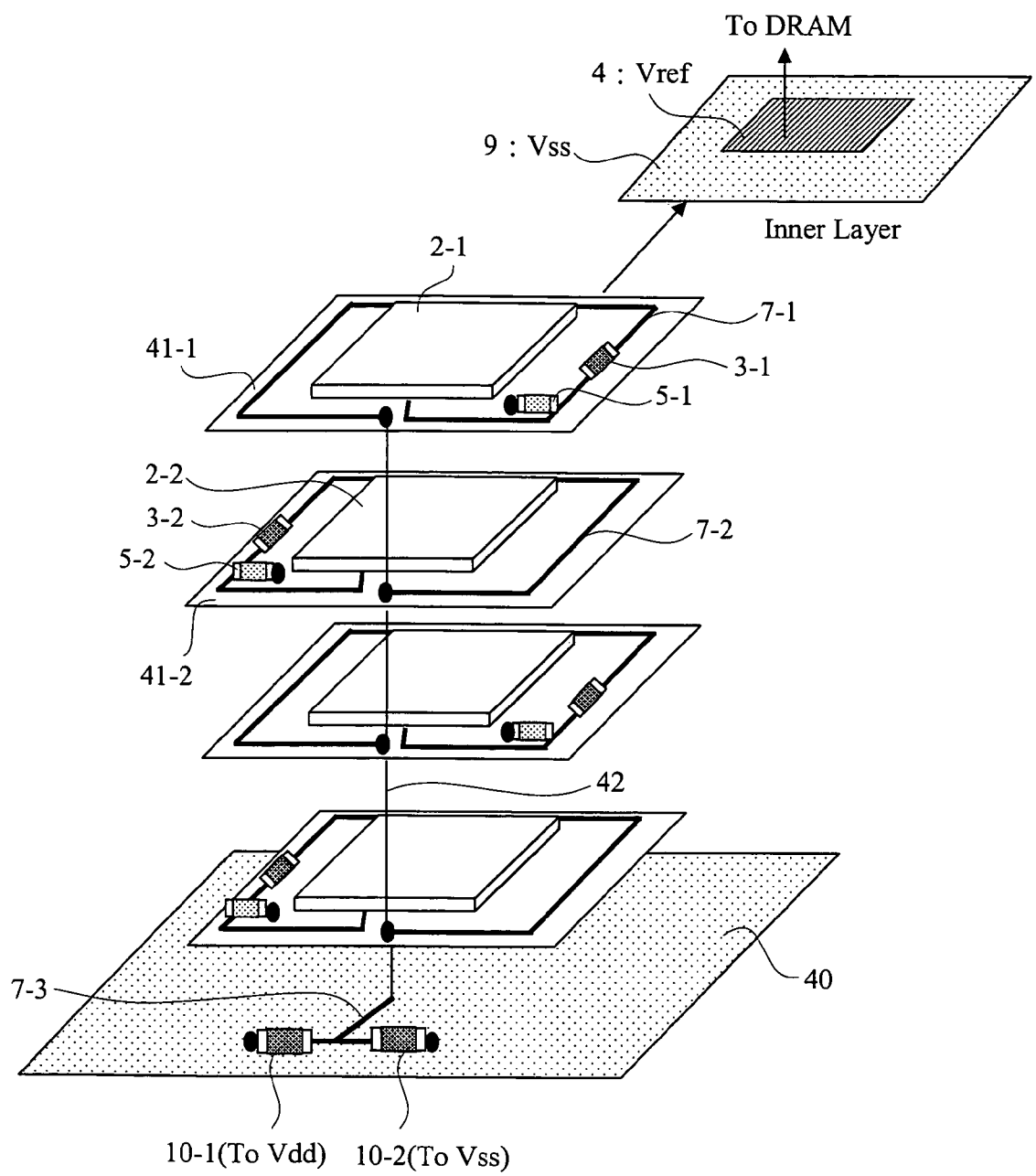
FIG. 27 is an explanatory view of a Vref wiring system 4 in a three-dimensional mounting system in a memory module according to a seventeenth embodiment of the present invention.

One example of a memory module according to the seventeenth embodiment will be explained with reference to FIG. 27.

The seventeenth embodiment has the same wiring constitution as the sixteenth embodiment, but it is mounted with chip resistors 10-1 and 10-2 on the interposer so that Vref feeding is performed by internal generation instead of external feeding.

Eighteenth Embodiment

Figure 28:
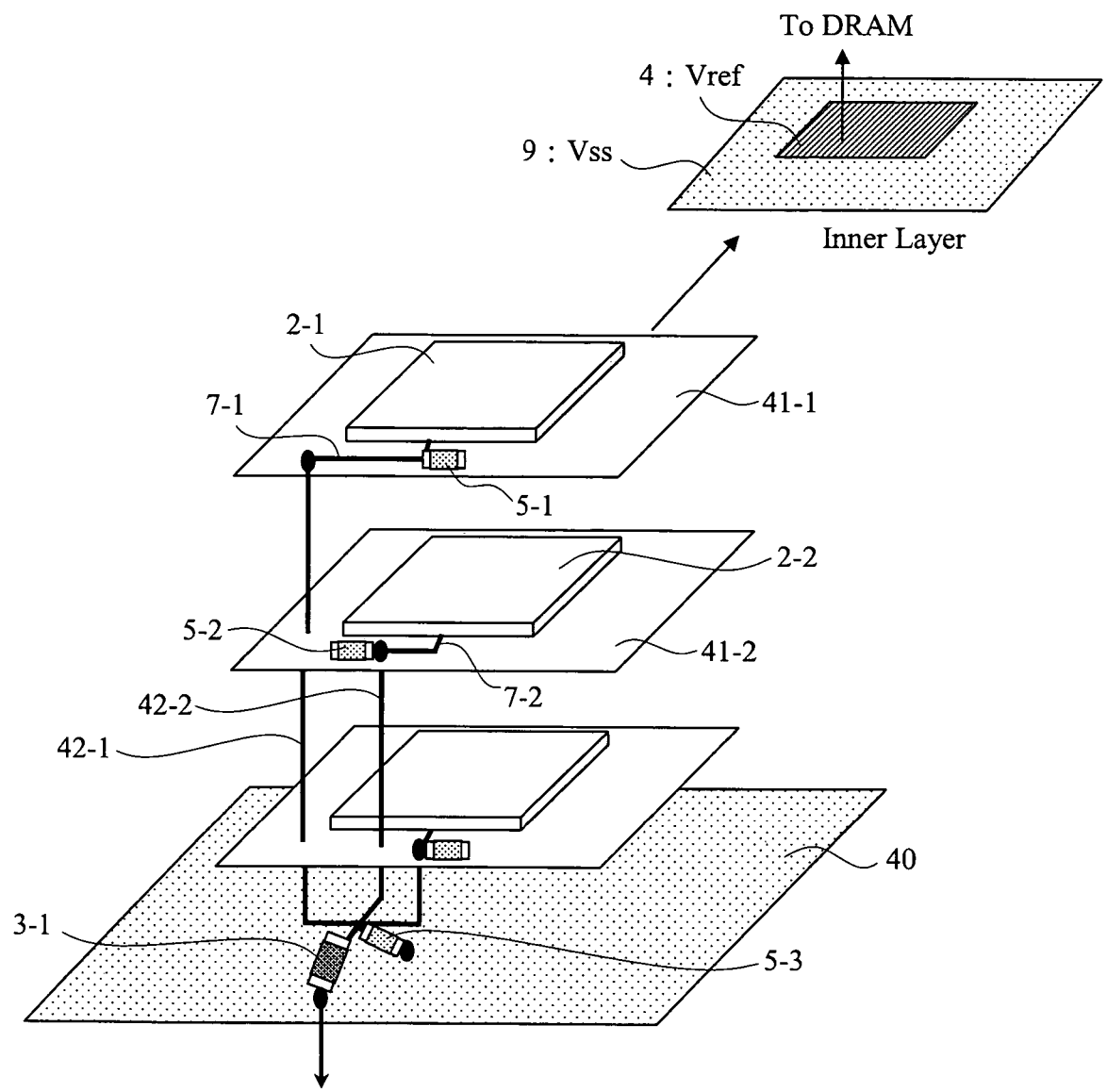
FIG. 28 is an explanatory view of a Vref wiring system 5 in a three-dimensional mounting system in a memory module according to an eighteenth embodiment of the present invention.

One example of a memory module according to the eighteenth embodiment will be explained with reference to FIG. 28.

The eighteenth embodiment is constituted to take a star topology when flip-chips to be stacked is wire-connected from an interposer. That is, since Vref wires between upper and lower memories adjacent to each other are not directly connected to each other, a propagation route is elongated, and inductance and resistance are made large, so that propagation noise among respective memories is reduced. The feature of the eighteenth embodiment lies in that it is unnecessary to elongate wires on the flip-chip base plates unnecessarily as compared with the fourteenth embodiment. However, the eighteenth embodiment has such a disadvantage or demerit that the number of wires increases, and a plurality of wire patterns on the flip-chip base plates must be prepared.

Nineteenth Embodiment

Figure 29:
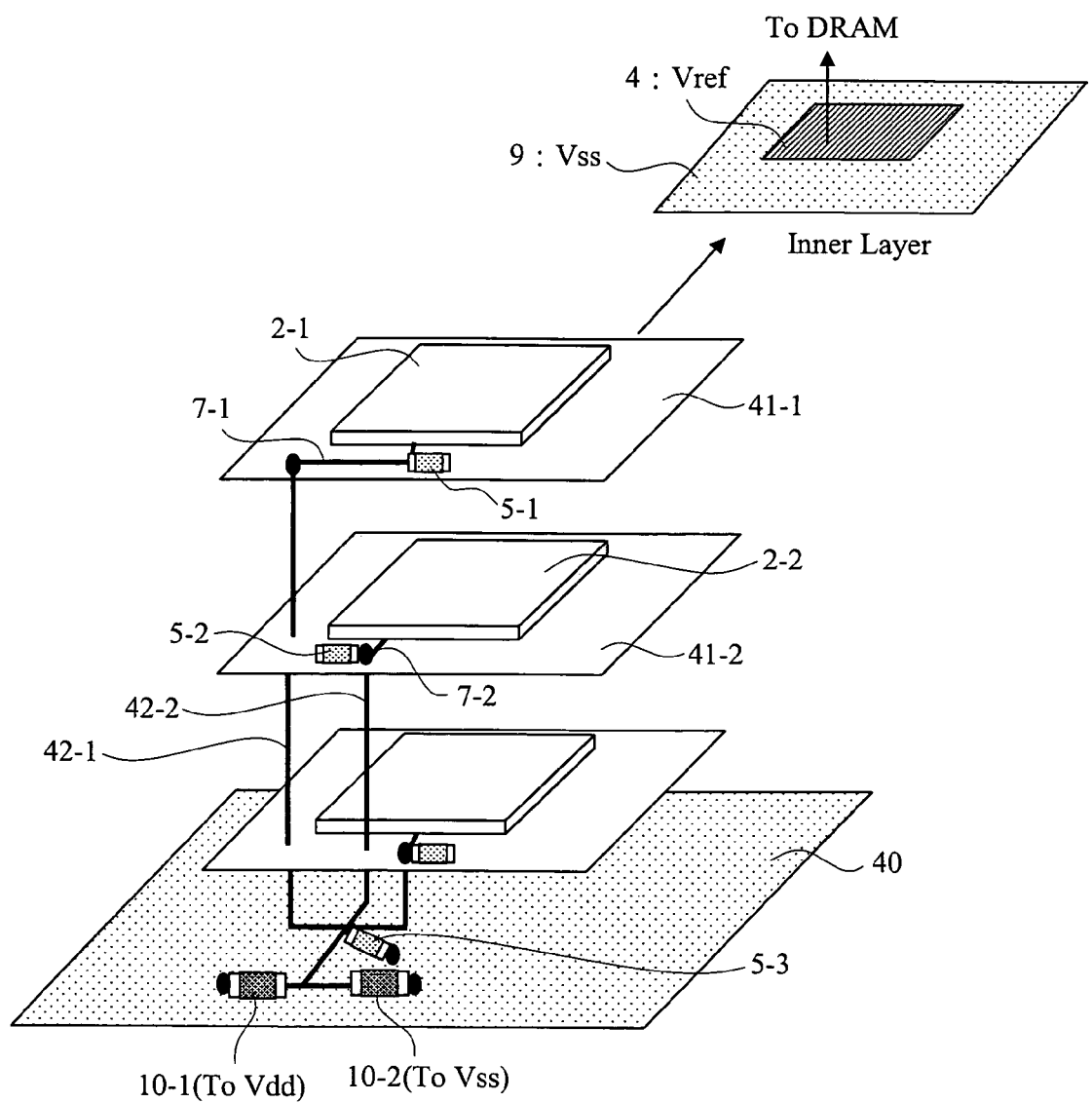
FIG. 29 is an explanatory view of a Vref wiring system 6 in a three-dimensional mounting system in a memory module according to a nineteenth embodiment of the present invention.

One example of a memory module according to the nineteenth embodiment will be explained with reference to FIG. 29.

The nineteenth embodiment has the same wiring constitution as the eighteenth embodiment, but it is mounted with chip resistors 10-1 and 10-2 on the interposer so that Vref feeding is performed by internal generation instead of external feeding.

Twentieth Embodiment

Figure 30:
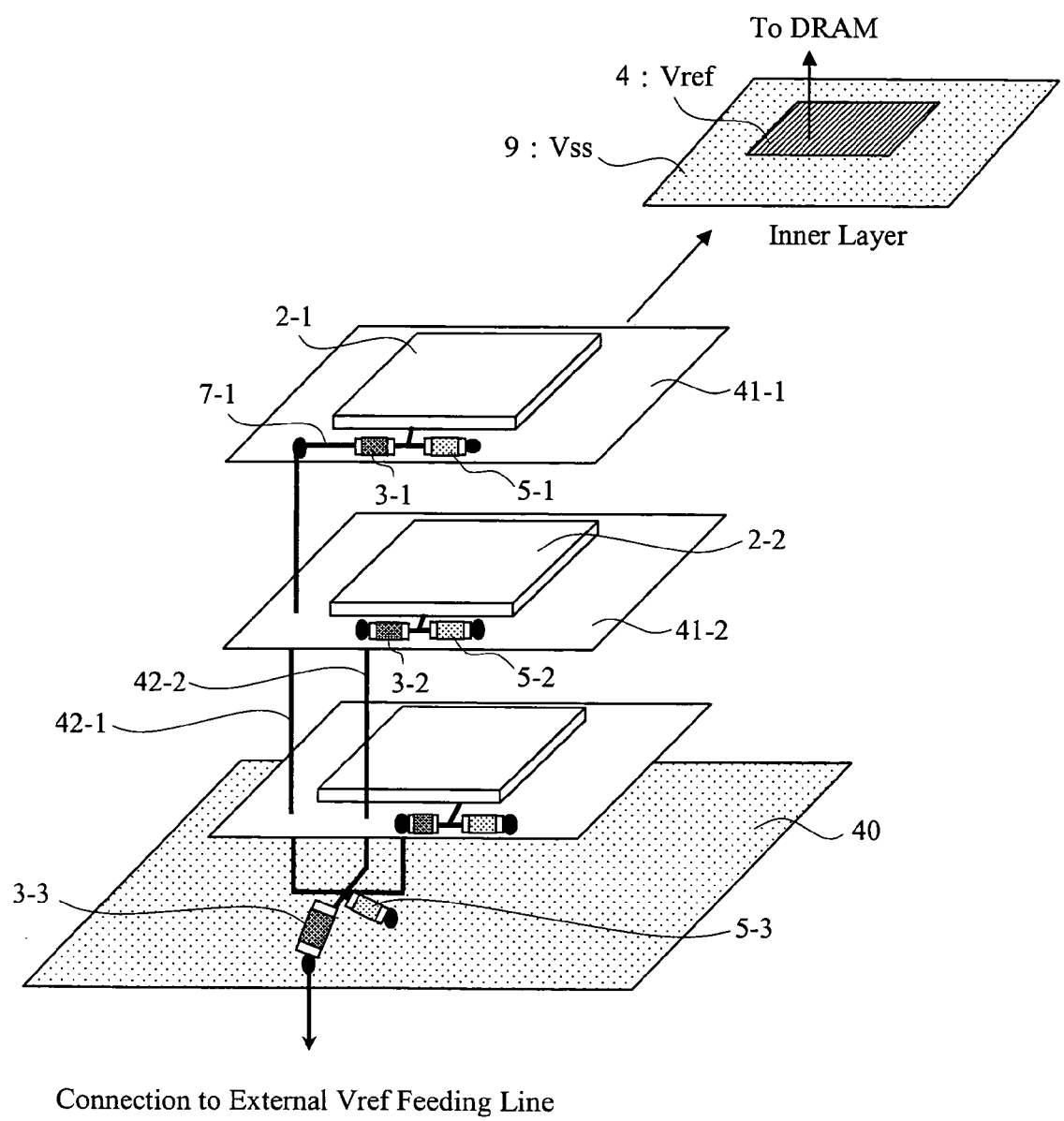
FIG. 30 is an explanatory view of a Vref wiring system 7 in a three-dimensional mounting system in a memory module according to a twentieth embodiment of the present invention.

One example of a memory module according to the twentieth embodiment will be explained with reference to FIG. 30.

The twentieth embodiment has substantially the same wiring constitution as the eighteenth embodiment, but it has high impedance chip parts 3-2 and 3-3 interposed in the Vref wires 7-1 and 7-2 on the flip-chips. Thereby, the twentieth embodiment can reduce propagation noise further effectively as compared with the eighteenth embodiment, but it includes such a disadvantage that the number of parts increases.

Twenty-first Embodiment

Figure 31:
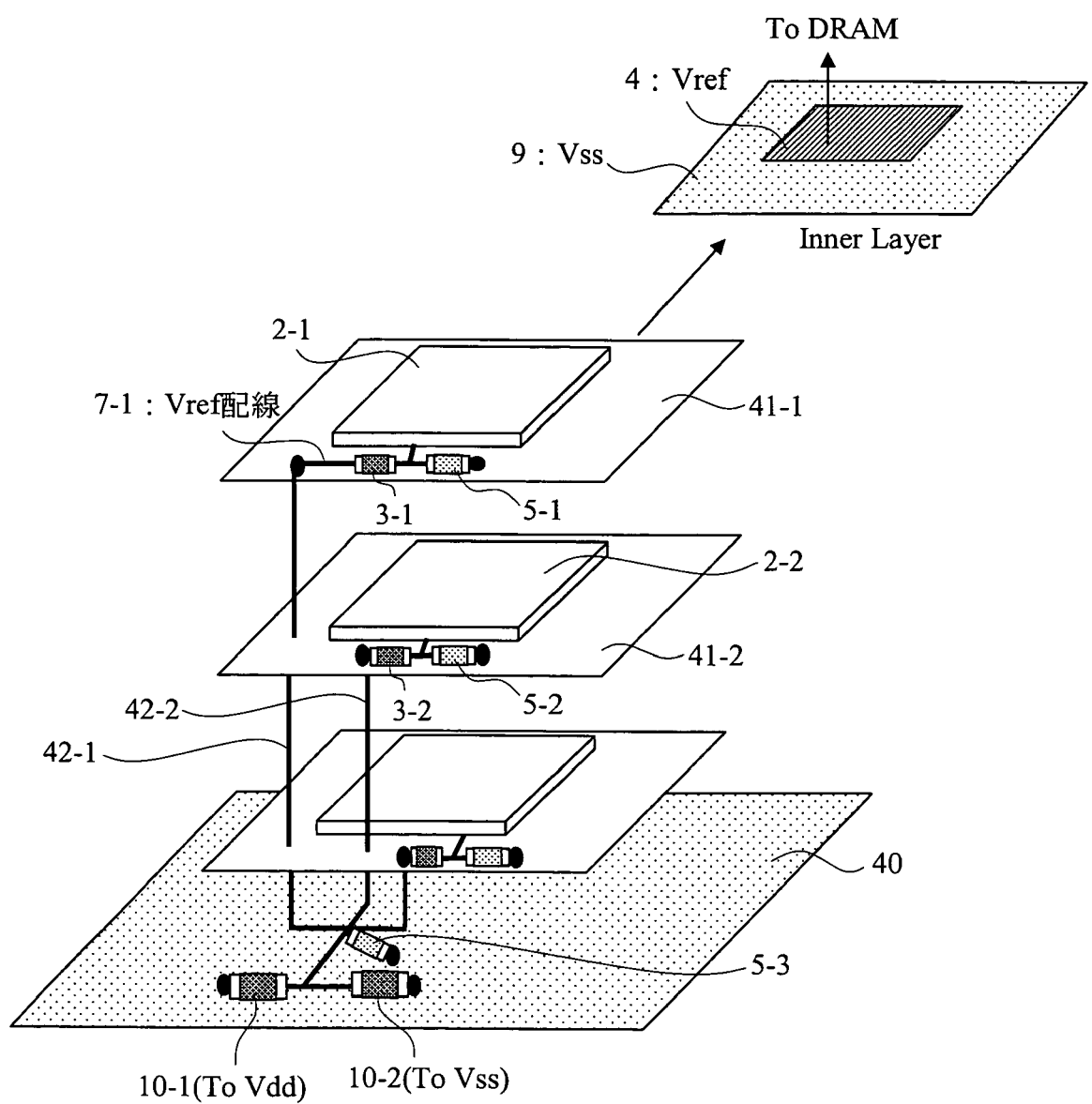
FIG. 31 is an explanatory view of a Vref wiring system 8 in a three-dimensional mounting system in a memory module according to a twenty-first embodiment of the present invention.

One example of a memory module according to the twenty-first embodiment will be explained with reference to FIG. 31.

The twenty-first embodiment has the same wiring constitution as the twentieth embodiment, but it is mounted with chip resistors 10-1 and 10-2 on the interposer so that Vref feeding is performed by internal generation instead of external feeding.

Twenty-second Embodiment

Twenty-second to twenty-third embodiments are embodiments adopting a multi-chip module.

Figure 32:
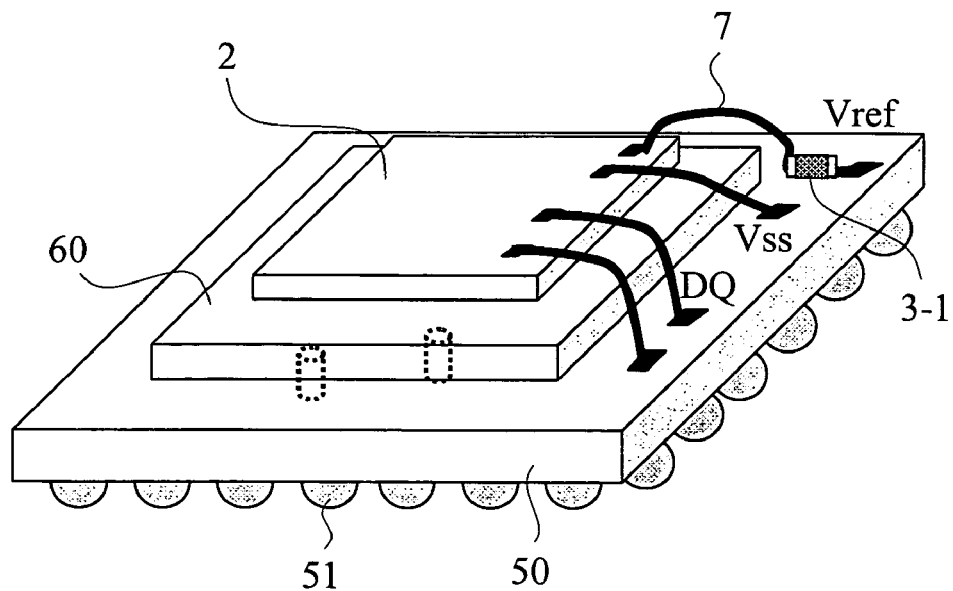
FIG. 32 is an explanatory view of a Vref wiring system 1 in a multi-chip module in a memory module according to a twenty-second embodiment of the present invention.

One example of a memory module according to the twenty-second embodiment will be explained with reference to FIG. 32.

In the multi-chip module, a BGA base plate 50 for taking electrical connection with a motherboard is provided at the lowermost layer, a memory controller 60 is mounted just above the BGA base plate 50, and a memory 2 is mounted on the memory controller 60. The BGA base plate and the memory are connected utilizing wire bond. BGA balls 51 for connection to the motherboard are provided on the BGA base plate 50.

In the twenty-second embodiment, a high impedance chip part 3-1 is mounted for feeding Vref to the memory 2 from the BGA base plate 50 via a Vref wire 7 so as to be interposed in the Vref wire 7. How to select a resistance of the high impedance chip part 3-1 is similar to that in the first embodiment.

Twenty-third Embodiment

Figure 33:
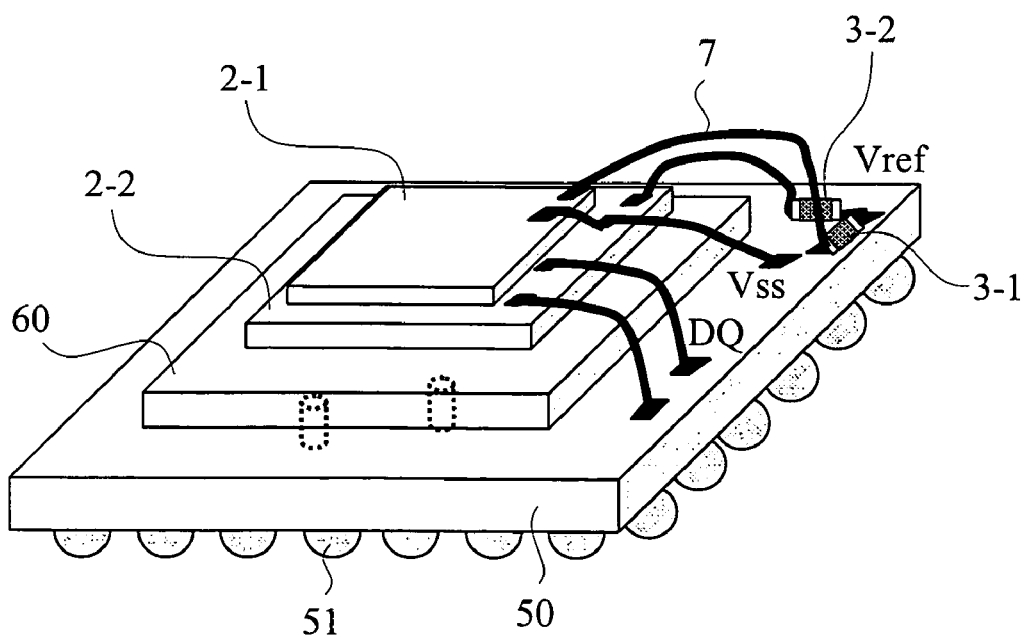
FIG. 33 is an explanatory view of a Vref wiring system 2 in a multi-chip module in a memory module according to a twenty-third embodiment of the present invention.

One example of a memory module according to the twenty-third embodiment will be explained with reference to FIG. 33.

The twenty-third embodiment shows a wiring method when a plurality of memories are mounted in the twenty-second embodiment. Wire bonds are individually used for the memories 2-1 and 2-2, and high impedance chip parts 3-1 and 3-2 are mounted on the respective memories. How to select a resistance of the high impedance chip part 3-1 or the like is similar to that in the first embodiment.

As described above, the inventions made by the present inventors have been specifically described based on the embodiments. However, needless to say, the present invention is not limited to the above-mentioned embodiments and may be variously altered and modified within the scope of not departing from the gist thereof.

The present invention is applicable to a design for a module mounted with various semiconductor devices, such as a memory module, handling a reference voltage.

What is claimed is:

1. A module comprising
    a semiconductor device using a reference voltage and a module base plate mounted with a plurality of the semiconductor devices,
    wherein the module base plate is mounted on a system base plate; reference voltage input portions of the plurality of the semiconductor devices mounted on the module base plate are connected with decoupling capacitors and reference voltage power source planes constituting a parallel plate with a Vss layer; and
    the decoupling capacitors and the reference voltage power source planes are provided near the semiconductor devices such that one of the decoupling capacitors and one of the reference voltage power source planes are assigned for each of the semiconductor devices individually.

2. The module according to claim 1, wherein
    the respective reference voltage power source planes of the semiconductors mounted on the module base plate adjacent to each other are connected to each other through a chip resistor, a chip inductor, or a long signal line.

3. The module according to claim 1, wherein
    second reference voltage power source planes are provided on the module base plate except for the first reference power source planes individually provided on the semiconductor devices,
    the second reference voltage power source planes are mounted with decoupling capacitors, and
    the second reference voltage power source planes and the first reference power source planes individually provided on the semiconductor devices are individually connected to each other by wires.

4. The module according to claim 3, wherein
    each of the wires has a chip resistor or a chip inductor in the course from one of the second reference voltage power source planes to a corresponding one of the first reference voltage power source planes.

5. The module according to claim 1, wherein
    respective reference voltage power source planes of the semiconductor devices mounted adjacent to each other on the module base plate and the reference voltage input portions of the semiconductor devices are connected by a wire in a dependent manner, and
    the wire has a chip resistor or a chip inductor between the semiconductor devices adjacent to each other.

6. The module according to claim 2, wherein
a resistance value R of a chip resistor mounted in a wiring route for distributing a reference voltage to the plurality of semiconductor devices on the module base plate, satisfies the following equation in relation to inductance L in the wire routes and capacitance $C_{dec}$ of the decoupling capacitor mounted near the semiconductor $$R \geq 2\sqrt{\frac{L}{C_{dec}}}. \quad \text{[Equation 1]}$$

7. The module according to claim 1, wherein
the module base plate supplies the reference voltage from the system base plate, and
a low pass filter, or a chip resistor, or a chip inductor is provided between a reference voltage input portion of the module base plate from the system base plate and the first one of the semiconductor devices mounted on the module base plate.

8. The module according to claim 1, wherein
one of the reference voltage power source planes on the module base plate has the same resistant value as that between a power source plane of the module base plate and a ground plane, and
a voltage value of half of a power source voltage is internally generated as the reference voltage.

9. The module according to claim 1, wherein a register or a buffer for assisting a high speed operation of the semiconductor is mounted on the module base plate, and
the reference voltage power source plane is not disposed near the register or the buffer.

10. The module according to claim 1, wherein
an interposer base plate for electrically connecting the module base plate and the system base plate is provided,
a plurality of sub-base plates which seal the semiconductor devices individually are provided,
the sub-base plates are mounded in a stacking direction using the interposer base plate as the lowermost layer, and
the sub-base plates are electrically connected to each other by a Via.

11. The module according to claim 10, wherein
reference voltage wires between the interposer base plate and the plurality of sub-base plates are connected by one Via,
the reference voltage wire of the sub-base plate is arranged such that a wiring route thereof is elongated on the sub-base plate,
the wires are arranged such that a wiring route thereof is elongated on the sub-base plates adjacent thereto,
decoupling capacitors are mounted in the wires, and
a reference voltage power source is provided on an inner layer of the sub-base plate.

12. The module according to claim 11, wherein
a chip resistor or a chip inductor is provided in the wiring route for the reference voltage wire of the sub-base plate.

13. The module according to claim 10, wherein
reference voltage wires between the interposer base plate and the plurality of sub-base plates are connected using individual Via for the respective sub-base plates.

14. The module according to claim 13, wherein
a chip resistor or a chip inductor is provided in the wiring route for the reference voltage wire of the sub-base plate.

15. The module according to claim 12, wherein
a resistance value R of chip resistors mounted in a wiring routes for distributing a reference voltage to the plurality of semiconductor devices on the module base plate, satisfies the following equation in relation to inductance L of a wiring route between each sub-base plate and the interposer base plate and capacitance $C_{dec}$ of a decoupling capacitor mounted near the semiconductor device $$R \geq 2\sqrt{\frac{L}{C_{dec}}}. \quad \text{[Equation 2]}$$

16. The module according to claims 10, wherein
the module base plate supplies the reference voltage from the system base plate, and
a low pass filter, or a chip resistor, or a chip inductor is provided between a reference voltage input portion of the interposer base plate in a reference voltage route of the module base plate and a Via for connection to the sub-base plate.

17. The module according to claim 10, wherein
a reference voltage route on the interposer base plate has the same resistance value as that between a power source plane of the interposer base plate and a ground plane, and
a voltage value of ½ of a power source voltage is internally generated as the reference voltage.

18. The module according to claim 1, wherein
an interposer base plate for electrically connecting the module base plate and the system base plate is provided,
a plurality of sub-base plates which seal the semiconductor devices individually are provided,
the sub-base plates are mounded in a stacking direction using the interposer base plate as the lowermost layer, and
the sub-base plates are electrically connected to each other by a wire.

19. The module according to claim 18, wherein
chip resistors are mounted in reference voltage wires between the interposer base plate and the plurality of sub-base plates.

20. The module according to claim 18, wherein
wires are provided in the reference voltage wires between the interposer base plate and the plurality of sub-base plates for individual sub-base plate, and
a chip resistor is mounted between each wire and the interposer base plate.

21. The module according to claim 19, wherein
a resistance value R of chip resistors mounted in a wiring route for distributing a reference voltage to the plurality of semiconductor devices on the module base plate, satisfies the following equation in relation to inductance L of a wiring route between each sub-base plate and the interposer base plate and capacitance $C_{dec}$ of a decoupling capacitor mounted near the semiconductor device $$R \geq 2\sqrt{\frac{L}{C_{dec}}}. \quad \text{[Equation 3]}$$

22. The module according to claim 4, wherein
a resistance value R of a chip resistor mounted in a wiring route for distributing a reference voltage to the plurality of semiconductor devices on the module base plate, satisfies the following equation in relation to inductance L in the wire routes and capacitance $C_{dec}$ of the decoupling capacitor mounted near the semiconductor $$R \geq 2\sqrt{\frac{L}{C_{dec}}}. \qquad \text{[Equation 1]}$$

23. The module according to claim 5, wherein
a resistance value R of a chip resistor mounted in a wiring route for distributing a reference voltage to the plurality of semiconductor devices on the module base plate, satisfies the following equation in relation to inductance L in the wire routes and capacitance $C_{dec}$ of the decoupling capacitor mounted near the semiconductor $$R \geq 2\sqrt{\frac{L}{C_{dec}}}. \qquad \text{[Equation 1]}$$

24. The module according to claim 14, wherein
a resistance value R of chip resistors mounted in a wiring routes for distributing a reference voltage to the plurality of semiconductor devices on the module base plate, satisfies the following equation in relation to inductance L of a wiring route between each sub-base plate and the interposer base plate and capacitance $C_{dec}$ of a decoupling capacitor mounted near the semiconductor device $$R \geq 2\sqrt{\frac{L}{C_{dec}}}. \qquad \text{[Equation 2]}$$

25. The module according to claim 20, wherein
a resistance value R of chip resistors mounted in a wiring route for distributing a reference voltage to the plurality of semiconductor devices on the module base plate, satisfies the following equation in relation to inductance L of a wiring route between each sub-base plate and the interposer base plate and capacitance $C_{dec}$ of a decoupling capacitor mounted near the semiconductor device $$R \geq 2\sqrt{\frac{L}{C_{dec}}}. \qquad \text{[Equation 3]}$$

* * * * *